(12) United States Patent
Hsiao et al.

(10) Patent No.: US 12,004,431 B2
(45) Date of Patent: Jun. 4, 2024

(54) STRUCTURE AND METHOD FOR MRAM DEVICES

(71) Applicant: Taiwan Semiconductor Manufacturing Company, Ltd., Hsinchu (TW)

(72) Inventors: Tsung-Chieh Hsiao, Changhua County (TW); Po-Sheng Lu, Hsinchu (TW); Wei-Chih Wen, Hsinchu (TW); Liang-Wei Wang, Hsinchu (TW); Yu-Jen Wang, Hsinchu (TW); Dian-Hau Chen, Hsinchu (TW); Yen-Ming Chen, Hsin-Chu County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 335 days.

(21) Appl. No.: 17/206,527

(22) Filed: Mar. 19, 2021

(65) Prior Publication Data
US 2022/0140228 A1    May 5, 2022

Related U.S. Application Data

(60) Provisional application No. 63/198,620, filed on Oct. 30, 2020.

(51) Int. Cl.
*H10N 50/80*    (2023.01)
*H10B 61/00*    (2023.01)
(Continued)

(52) U.S. Cl.
CPC ............. *H10N 50/80* (2023.02); *H10B 61/00* (2023.02); *H10N 50/01* (2023.02); *H10N 50/85* (2023.02)

(58) Field of Classification Search
CPC ......... H10N 50/10; H10N 50/85; H10B 61/00
See application file for complete search history.

(56) References Cited

U.S. PATENT DOCUMENTS 6,873,535 B1    3/2005  Wang et al.
6,946,698 B1    9/2005  Lin et al.
(Continued)

FOREIGN PATENT DOCUMENTS

DE    102018124716 A1    5/2019
JP    2008171882 A    7/2008
(Continued)

OTHER PUBLICATIONS

Shen, Hsiang-Ku, et al., "Semiconductor Memory Device and Method of Forming the Same," U.S. Appl. No. 16/998,911, filed Aug. 20, 2020, Assignee: Taiwan Semiconductor Manufacturing Co., Ltd., 22 pages specification, 20 pages drawings.
(Continued)

*Primary Examiner* — Mary A Wilczewski
*Assistant Examiner* — Adin Hrnjic
(74) *Attorney, Agent, or Firm* — Haynes and Boone, LLP

(57) ABSTRACT

A semiconductor device includes a bottom electrode; a magnetic tunneling junction (MTJ) element over the bottom electrode; a top electrode over the MTJ element; and a sidewall spacer abutting the MTJ element, wherein at least one of the bottom electrode, the top electrode, and the sidewall spacer includes a magnetic material.

20 Claims, 23 Drawing Sheets

(51) Int. Cl.
    *H10N 50/01*     (2023.01)
    *H10N 50/10*     (2023.01)
    *H10N 50/85*     (2023.01)

(56) References Cited

U.S. PATENT DOCUMENTS

| | | |
|---|---|---|
| 7,099,176 B2 | 8/2006 | Tang et al. |
| 7,170,775 B2 | 1/2007 | Tang et al. |
| 9,449,841 B2 | 9/2016 | Suen et al. |
| 9,777,378 B2 | 10/2017 | Nemani et al. |
| 10,270,025 B2 | 4/2019 | Chuang et al. |
| 10,707,413 B1* | 7/2020 | Dutta .................. H10N 50/01 |
| 2007/0241410 A1 | 10/2007 | Umehara |
| 2009/0166817 A1 | 12/2009 | Tsai et al. |
| 2011/0233697 A1 | 9/2011 | Kajiyama |
| 2014/0252518 A1 | 9/2014 | Zhang |
| 2014/0377954 A1 | 12/2014 | Lu et al. |
| 2016/0351792 A1* | 12/2016 | Jiang .................. H10B 61/20 |
| 2017/0114465 A1 | 10/2017 | Kalutarage et al. |
| 2018/0158728 A1* | 6/2018 | Chu .................. H10B 63/80 |
| 2019/0165261 A1 | 5/2019 | Kim |
| 2020/0098978 A1 | 3/2020 | Liao et al. |
| 2020/0136026 A1 | 4/2020 | Peng et al. |
| 2020/0176673 A1* | 6/2020 | Chung .................. H10N 50/10 |
| 2020/0185454 A1 | 6/2020 | Yang |
| 2020/0303629 A1 | 9/2020 | Chuang |

FOREIGN PATENT DOCUMENTS

| | | |
|---|---|---|
| JP | 2013201343 A | 10/2013 |
| KR | 20200049440 A | 5/2020 |

OTHER PUBLICATIONS

Hsiang-Ku Shen et al. "Structure and Method for Integrating MRAM and Logic Devices," U.S. Appl. No. 17/104,203, filed Nov. 25, 2020, Assignee: Taiwan Semiconductor Manufacturing Company, Ltd., 27 pages specification, 22 pages drawings.

* cited by examiner

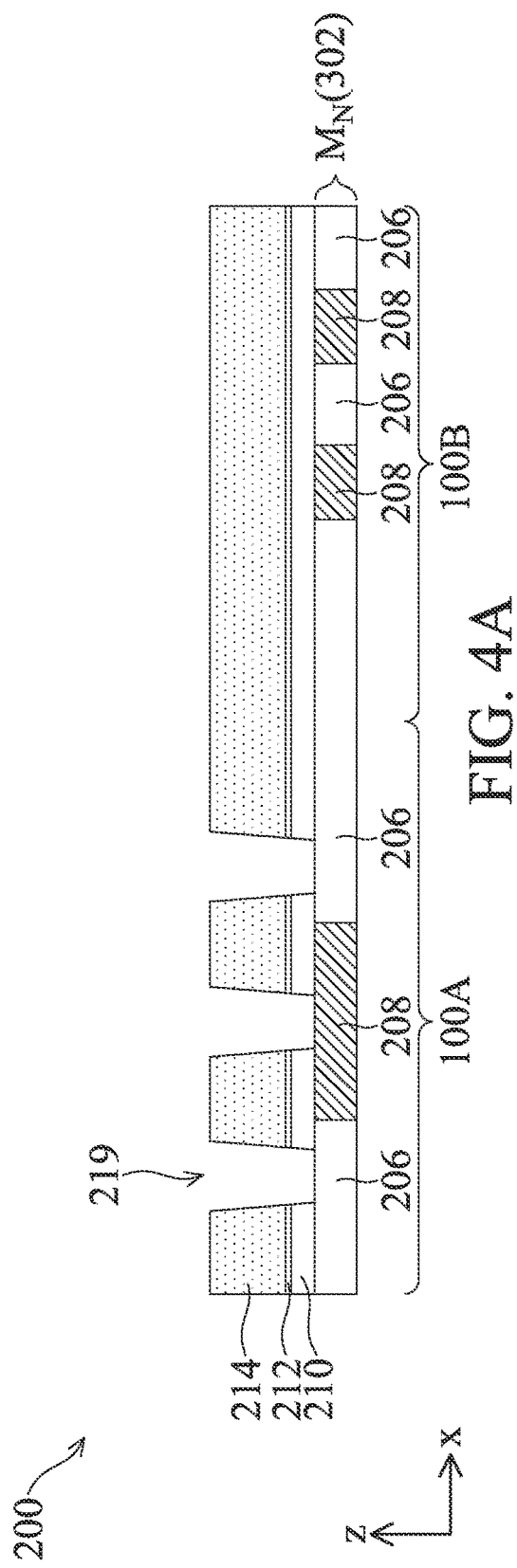
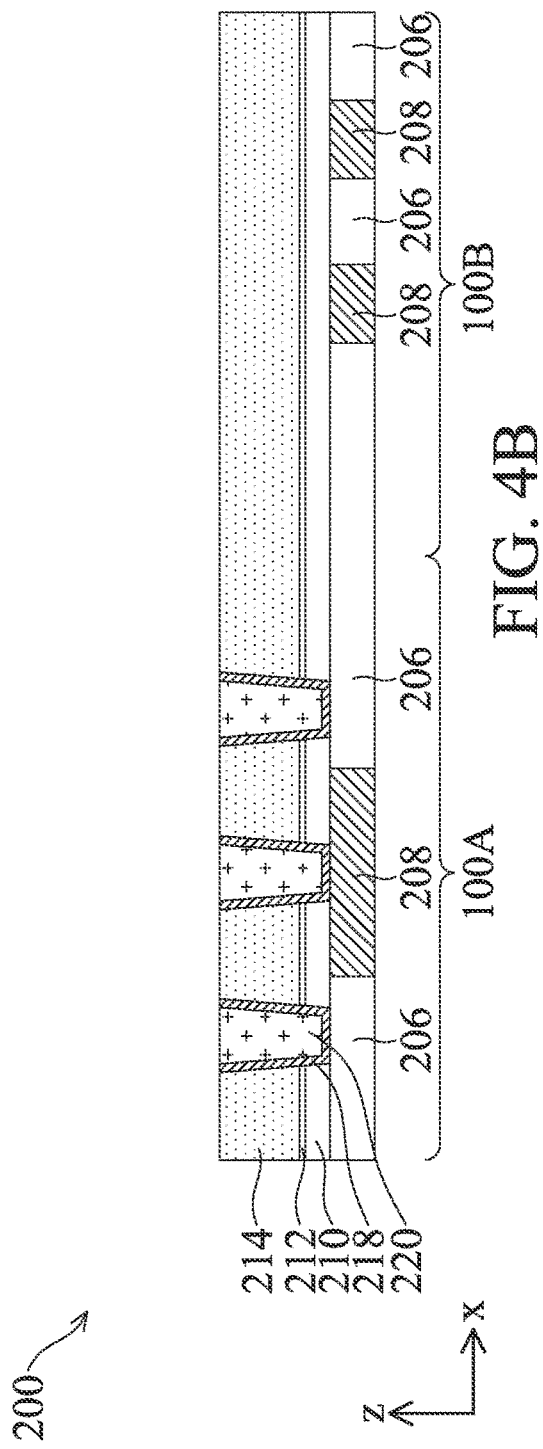

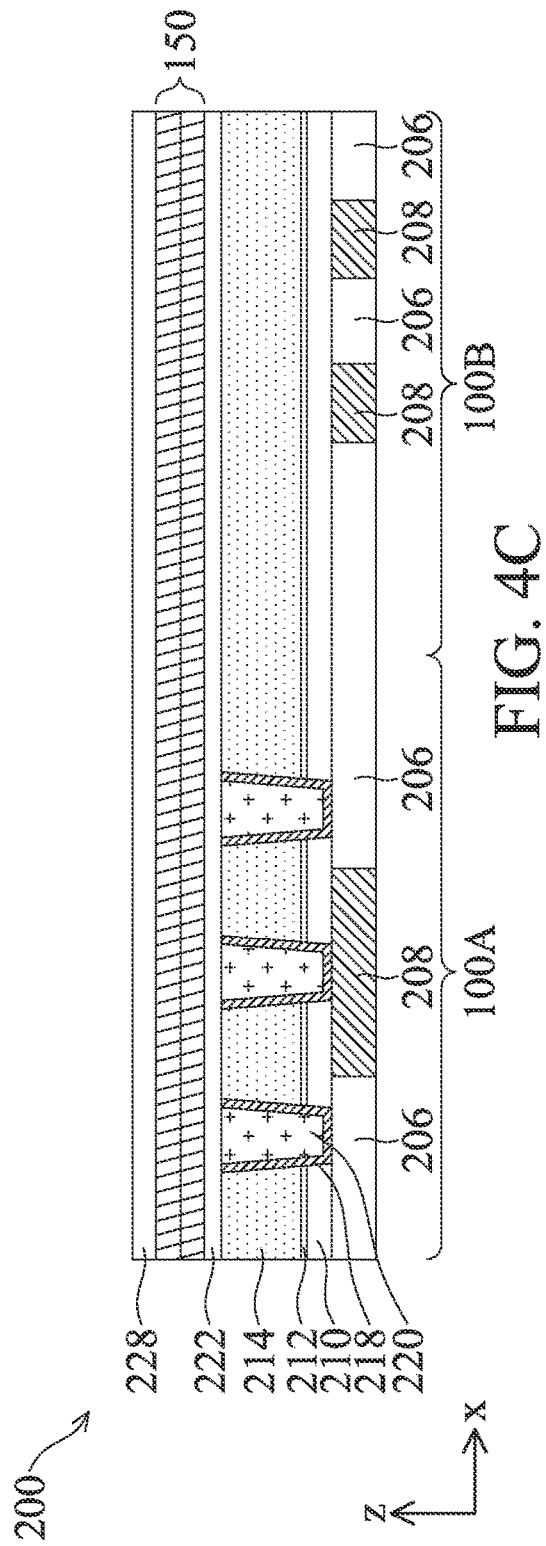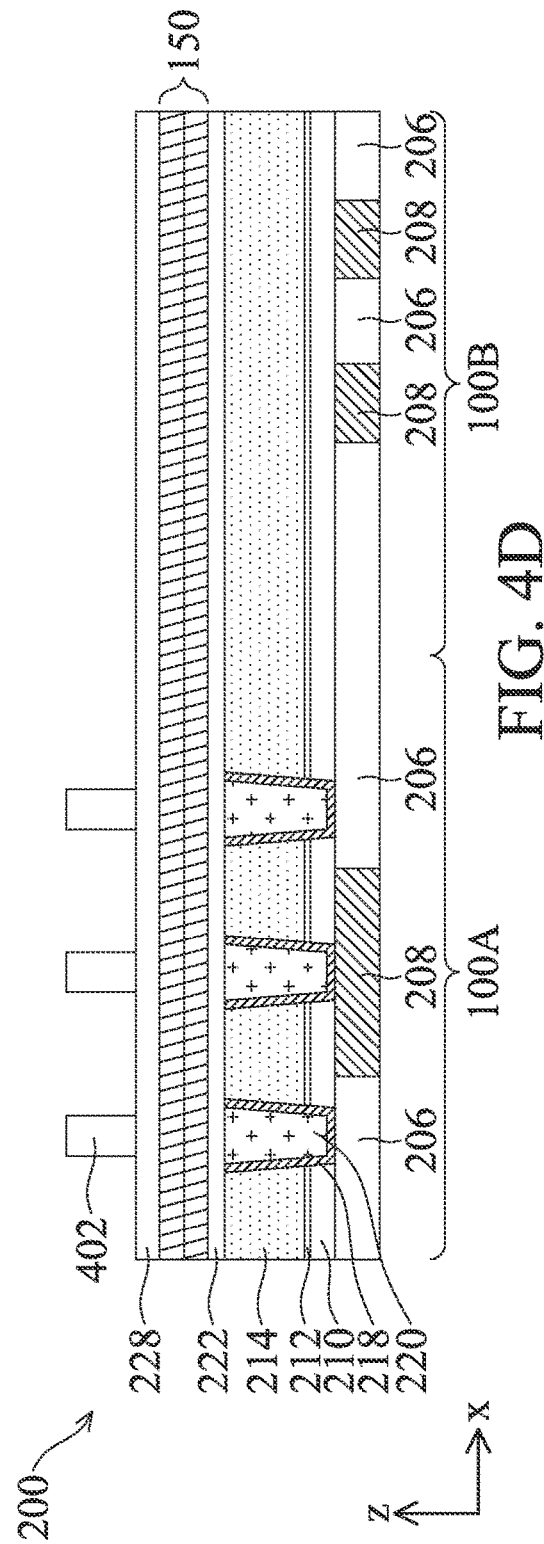

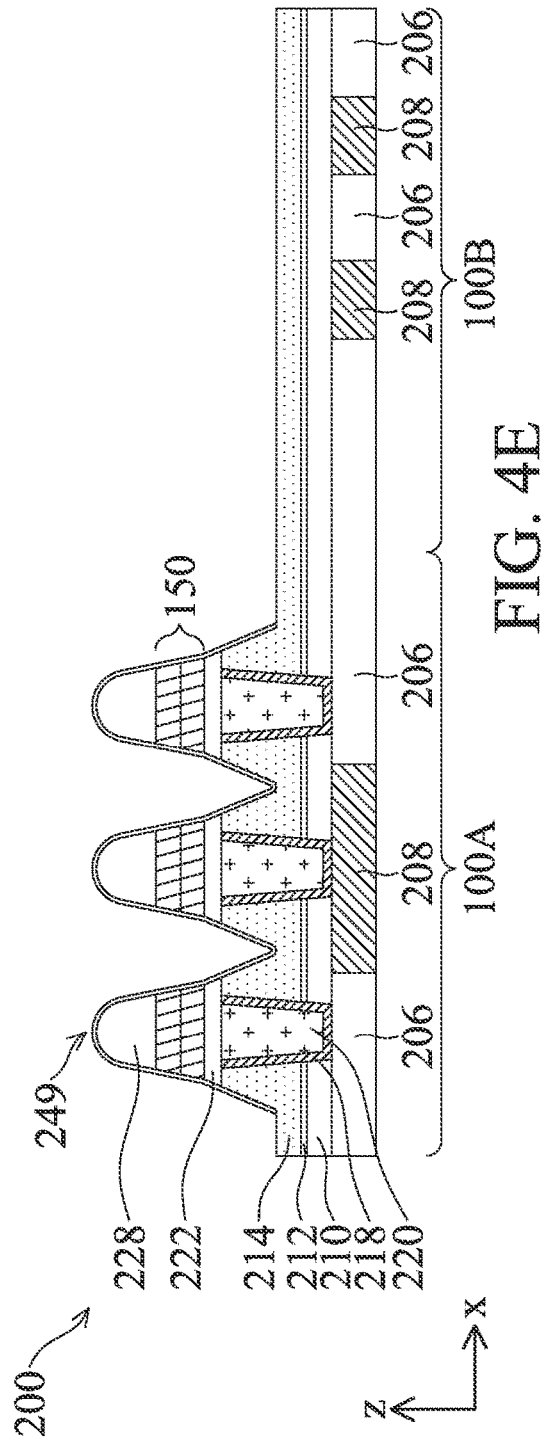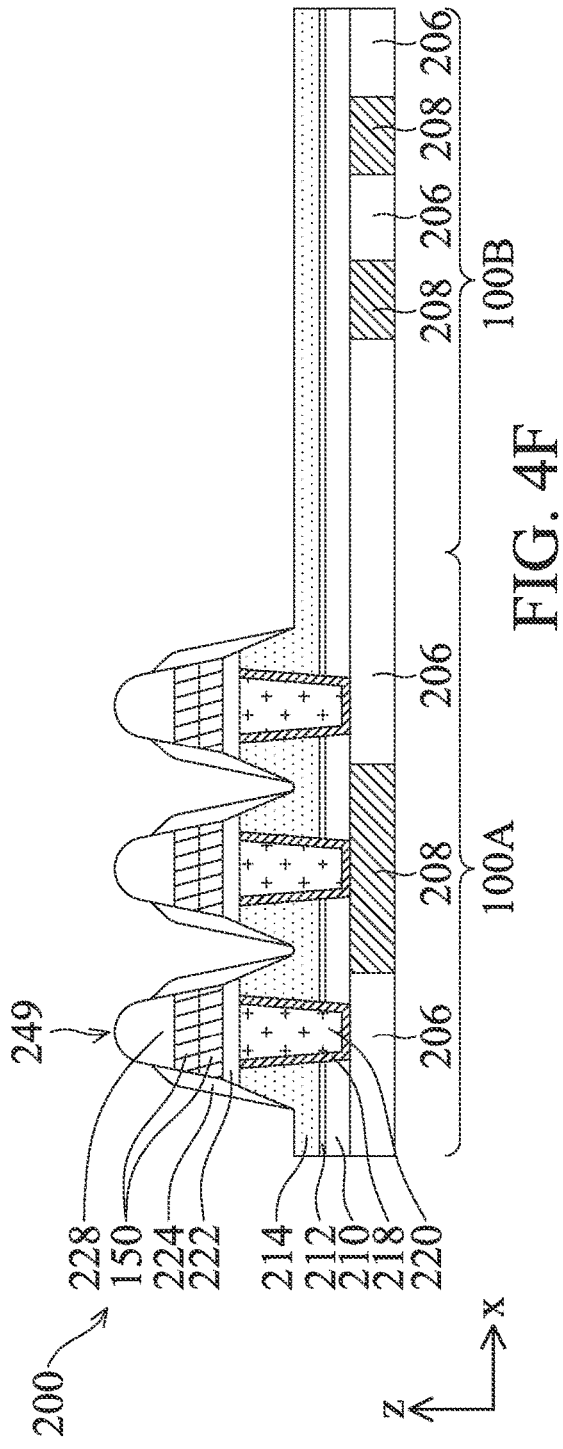

STRUCTURE AND METHOD FOR MRAM DEVICES

PRIORITY

This application claims the benefits to U.S. Provisional Application No. 63/198,620, filed Oct. 30, 2020, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement in some IC design and fabrication has been the developing of non-volatile memory (NVM), and particularly magnetic random-access memory (MRAM). In some implementations, MRAM can offer comparable performance to volatile static random-access memory (SRAM) and comparable density with lower power consumption than volatile dynamic random-access memory (DRAM). Compared to NVM Flash memory, MRAM may offer faster access and suffer less degradation over time. An MRAM cell is formed by a magnetic tunneling junction (MTJ) comprising two ferromagnetic layers which are separated by a thin insulating barrier and operate by tunneling of electrons between the two ferromagnetic layers through the insulating barrier. Although existing approaches in MRAM device formation have generally been adequate for their intended purposes, they have not been entirely satisfactory in all respects. For example, it is desirable to provide improved shielding for MRAM devices against magnetic interference.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A, 4B, 4C, 4D, 4E, 4F, 4G, 4H, 4I, 4J, 4K, 4K-1, 4L, 4L-1, 4M, 4M-1, 4N, and 4N-1 illustrate cross-sectional views of a semiconductor structure during a fabrication process according to the method of FIGS. 3A-3B, in accordance with some embodiments.

DETAILED DESCRIPTION

Figure 1A:
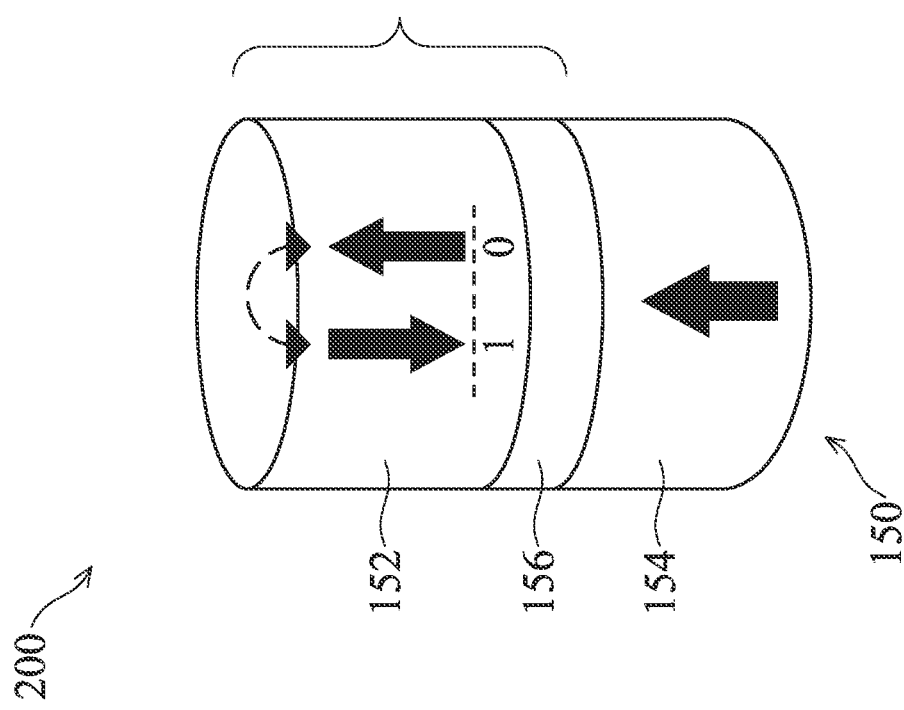
FIGS. 1A and 1B illustrate perspective views of a semiconductor device with an MRAM integrated therein.
Figure 1A:
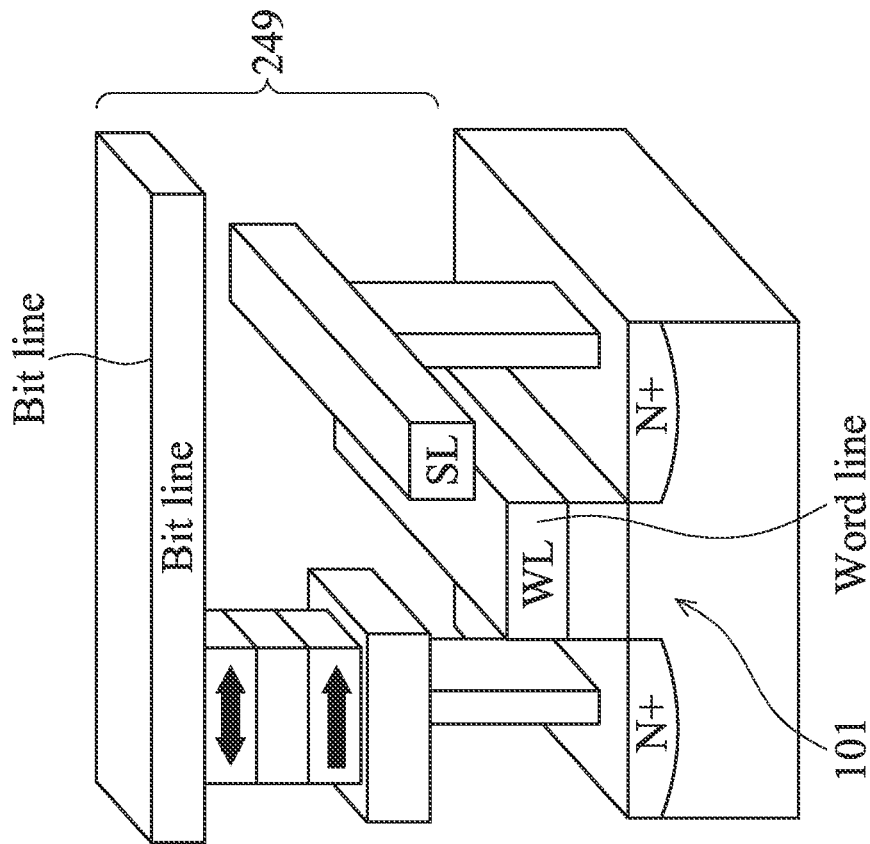

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to semiconductor devices and fabrication methods. More particularly, the present disclosure is related to providing a semiconductor device with an array of MRAM devices (or cells) where each MRAM device includes a magnetic shield for improving the MRAM device's performance against magnetic interference. The magnetic shield may be provided as a magnetic material in a bottom electrode, a magnetic material in a sidewall spacer, and/or a magnetic material in a top electrode.

In some embodiments, the MRAM devices are provided in a memory device region (or MRAM region) of the semiconductor device and logic devices are provided in a logic device region (or logic region) of the semiconductor device. The memory device region may include an array of MRAM devices arranged into row and columns. The MRAM devices in the same row are connected to a common word line, and the MRAM devices in the same column are connected to a common bit line. The array may be connected to and controlled by the logic devices of the logic region.

The MRAM devices of the present disclosure may be formed over a semiconductor structure that includes a semiconductor substrate. Upon the semiconductor substrate certain devices may be formed such as field effect transistors (FET) having the associated gate, source, and drain features.

Also disposed on the semiconductor structure may be one or more layers of a multi-layer interconnect (or MLI) that includes horizontally extending conductive lines (e.g., metallization layers) and vertically extending conductive vias. The MLI may interconnect one or more of the devices (e.g., FETs) formed on the substrate. In an embodiment, at least one metallization layer of the MLI is formed on the semiconductor structure, while other metallization layers of the MLI may be formed after (e.g., above) the MRAM device fabricated as discussed below. In other words, the MRAM device is disposed within a metallization layer of the MLI.

Figure 1B:
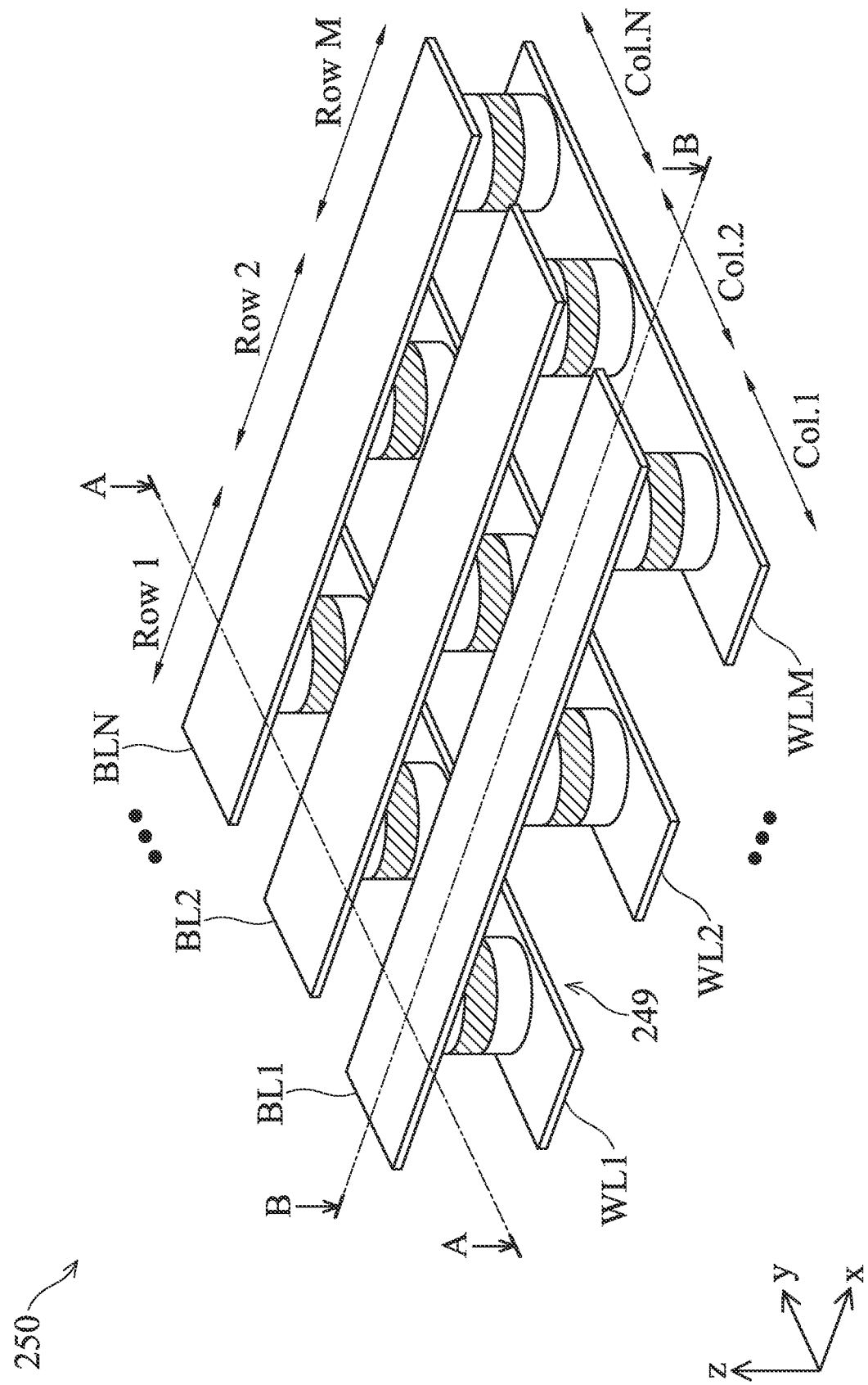

FIGS. 1A and 1B illustrate perspective views of a semiconductor device 200 having an MRAM array 250. Particularly, FIG. 1A illustrates a building block of the MRAM array 250—an MRAM cell 249 having an MTJ 150 (or MTJ stack 150). The MTJ 150 includes an upper ferromagnetic plate 152 and a lower ferromagnetic plate 154, which are separated by a thin insulating layer 156, also referred to as a tunnel barrier layer. One of the two ferromagnetic plates (e.g., the lower ferromagnetic plate 154) is a magnetic layer that is pinned to an antiferromagnetic layer, while the other ferromagnetic plate (e.g., the upper ferromagnetic plate 152) is a "free" magnetic layer that can have its magnetic field changed to one of two or more values to store one of two or more corresponding data states.

The MTJ 150 uses tunnel magnetoresistance (TMR) to store magnetic fields on the upper and lower ferromagnetic plates 152 and 154. For a sufficiently thin insulating layer 156 (e.g., about 10 nm or less thick), electrons can tunnel from the upper ferromagnetic plate 152 to the lower ferromagnetic plate 154. Data may be written to the cell in many ways. In one method, current is passed between the upper and lower ferromagnetic plates 152 and 154, which induces a magnetic field stored in the free magnetic layer (e.g., the upper ferromagnetic plate 152). In another method, spin-transfer-torque (STT) is utilized, wherein a spin-aligned or polarized electron flow is used to change the magnetic field within the free magnetic layer with respect to the pinned magnetic layer. Other methods to write data may be used. However, all data write methods include changing the magnetic field within the free magnetic layer with respect to the pinned magnetic layer.

The electrical resistance of the MTJ 150 changes in accordance with the magnetic fields stored in the upper and lower ferromagnetic plates 152 and 154, due to the magnetic tunnel effect. For example, when the magnetic fields of the upper and lower ferromagnetic plates 152 and 154 are aligned (or in the same direction), the MTJ 150 is in a low-resistance state (i.e., a logical "0" state). When the magnetic fields of the upper and lower ferromagnetic plates 152 and 154 are in opposite directions, the MTJ 150 is in a high-resistance state (i.e., a logical "1" state). The direction of the magnetic field of the upper ferromagnetic plate 152 can be changed by passing a current through the MTJ 150. By measuring the electrical resistance between the upper and lower ferromagnetic plates 152 and 154, a read circuitry coupled to the MTJ 150 can discern between the "0" and "1" states. FIG. 1A further shows that the upper ferromagnetic plate 152 of an MTJ 150 is coupled to a bit line, the lower ferromagnetic plate 154 of an MTJ 150 is coupled to a source (or drain) of a transistor in a transistor structure 101, the drain (or source) of the transistor is coupled to a supply line (SL), and the gate of the transistor is coupled to a word line (WL). The MTJ 150 can be accessed (such as read or written) through the bit line, word line, and the supply line. Since the MTJ 150 utilizes magnetization to store binary digitized information, there is a risk that its data may be adversely interfered by large external magnetic fields. An object of the present disclosure is to provide structures that can protect the MTJ 150 from effects of external magnetic fields.

FIG. 1B illustrates an MRAM array 250, which includes M rows (words) and N columns (bits) of MRAM cells (or MRAM devices) 249. Each MRAM cell 249 comprises an MTJ 150. Word lines $WL_1$, $WL_2$, ... $WL_M$ extend across respective rows of MRAM cells 249 and bit lines $BL_1$, $BL_2$, ... $BL_N$ extend along columns of MRAM cells 249.

Figure 1C:
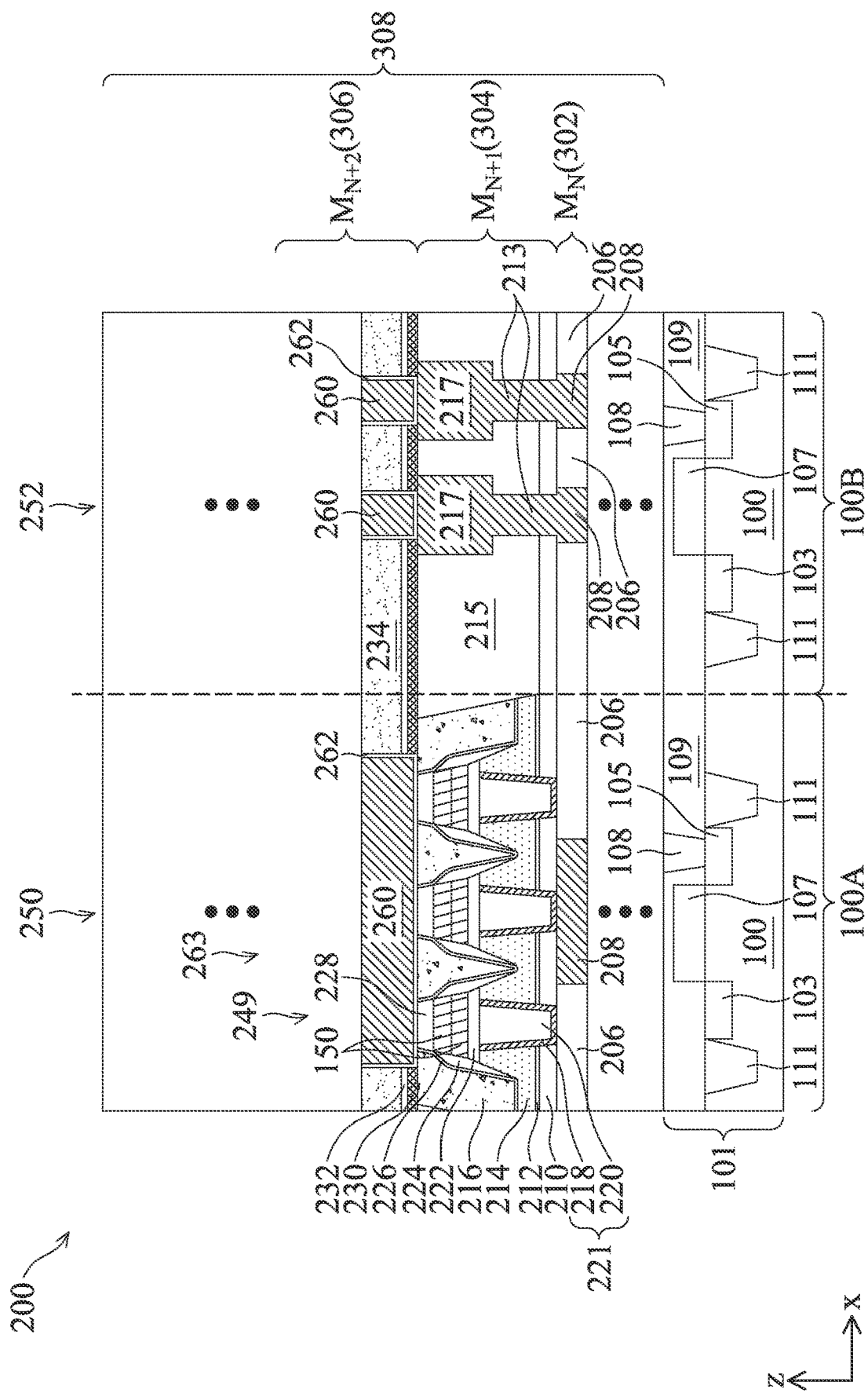
FIG. 1C illustrates a cross-sectional view of the semiconductor device in FIGS. 1A and 1B, in accordance with an embodiment.

FIG. 1C shows a cross-sectional view of the semiconductor device 200 along the bit line direction of the MRAM array 250 (i.e., the B-B line in FIG. 1B), showing both the MRAM array 250 and logic devices 252 in the same figure, in accordance with some embodiments of the present disclosure. Referring to FIG. 1C, the MRAM array 250 is provided in a MRAM region 100A, while the logic devices 252 are provided in a logic region 100B. The logic devices 252 may be used for implementing write/read logic for accessing the MRAM array 250 or perform other functions. The MRAM region 100A and the logic region 100B have a common transistor structure 101 in or on a semiconductor substrate 100.

In some embodiments, the semiconductor substrate 100 may be but is not limited to, a silicon substrate (such as a silicon wafer). Alternatively, the substrate 100 includes another elemental semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate 100 is a semiconductor on insulator (SOI). In other alternatives, semiconductor substrate 100 may include a doped epitaxial layer, a gradient semiconductor layer, and/or a semiconductor layer overlying another semiconductor layer of a different type, such as a silicon layer on a silicon germanium layer. The semiconductor substrate 100 may or may not include doped regions, such as a p-well, an n-well, or combinations thereof.

The semiconductor substrate 100 further includes heavily doped regions such as sources 103 and drains 105 at least partially in the semiconductor substrate 100. A gate 107 is positioned over a top surface of the semiconductor substrate 100 and between the source 103 and the drain 105. Contact plugs 108 are formed in inter-layer dielectric (ILD) 109 and may be electrically coupled to the transistor structure 101. In some embodiments, the ILD 109 is formed on the semiconductor substrate 100. The ILD 109 may be formed by a variety of techniques for forming such layers, e.g., chemical vapor deposition (CVD), low-pressure CVD (LPCVD), plasma-enhanced CVD (PECVD), sputtering and physical vapor deposition (PVD), thermal growing, and the like. The ILD 109 may be formed from a variety of dielectric materials such as an oxide, an oxynitride, silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The transistors in the transistor structure 101 can be planar transistors or non-planar transistor, such as FinFET or gate-all-around (GAA) transistors.

In some embodiments, a shallow trench isolation (STI) 111 is provided to define and electrically isolate adjacent transistors. A number of STI 111 are formed in the semiconductor substrate 100. The STI 111 may, for example, include an oxide, an oxynitride, silicon dioxide ($SiO_2$), a nitrogen-bearing oxide (e.g., nitrogen-bearing $SiO_2$), a nitrogen-doped oxide (e.g., N$_2$-implanted SiO$_2$), silicon oxynitride (Si$_x$O$_y$N$_z$), and the like. The STI 111 may also be formed of any suitable "high dielectric constant" or "high K" material, where K is greater than or equal to about 8, such as titanium oxide (Ti$_x$O$_y$, e.g., TiO$_2$), tantalum oxide (Ta$_x$O$_y$, e.g., Ta$_2$O$_5$), and the like. Alternatively, the STI 111 may also be formed of any suitable "low dielectric constant" or "low-k" dielectric material, where k is less than or equal to about 4.

FIG. 1C further illustrates that the semiconductor device 200 includes a multilayer interconnect (MLI) structure 308 over the transistor structure 101. The interconnect structure 308 includes three adjacent metal layers 302, 304, and 306 and other metal layers not shown. For example, there are metal layers over the metal layer 306 in some embodiments. For example, there are one or more metal layers below the metal layer 302 in some embodiments. The metal layer 302 is the $N^{th}$ metal layer above the top surface of the transistor structure 101, while the metal layers 304 and 306 are the $(N+1)^{th}$ metal layer and the $(N+2)^{th}$ metal layer, respectively. Thus, the metal layers 302, 304, and 306 are also referred to metal layers $M_N$, $M_{N+1}$, and $M_{N+2}$ in some embodiments. The number N can be any natural number. For example, N may be 3, 4, 5, 6, or another natural number. In the present embodiment, the MRAM cells 249 are implemented in the metal layer 304.

The metal layer 302 includes an inter-metal dielectric (IMD) layer 206 and metal lines 208 in both the MRAM region 100A and the logic region 100B. The IMD layer 206 can be an oxide, such as silicon dioxide, a low-k dielectric material such as carbon doped oxides, or an extreme low-k dielectric material such as porous carbon doped silicon dioxide. The metal lines 208 can be made of a metal, such as aluminum, copper, or combinations thereof.

In an embodiment, the dielectric layer 212 includes a metal-based dielectric material, such as aluminum oxide (i.e., AlO$_x$ such as Al$_2$O$_3$). In an embodiment, the dielectric layer 214 includes a low-k dielectric material, such as a silicon oxide based low-k dielectric material. For example, the dielectric layer 214 may include un-doped silicate glass (USG), or doped silicon oxide such as borophosphosilicate glass (BPSG), fluorosilicate glass (FSG), phosphosilicate glass (PSG), boron doped silicate glass (BSG), and/or other suitable dielectric materials. In an embodiment, the dielectric layer 216 includes one or more oxide based dielectric materials such as silicon dioxide, tetraethylorthosilicate (TEOS) formed oxide, un-doped silicate glass, or doped silicon oxide such as borophosphosilicate glass (BPSG), fluorosilicate glass (FSG), phosphosilicate glass (PSG), boron doped silicon glass (BSG), and/or other suitable dielectric materials.

In an embodiment, the dielectric layer 212 includes a metal-based dielectric material, such as aluminum oxide (i.e., AlO$_x$ such as Al$_2$O$_3$). In an embodiment, the dielectric layer 214 includes a low-k dielectric material, such as a silicon oxide based low-k dielectric material. For example, the dielectric layer 214 may include un-doped silicate glass (USG), or doped silicon oxide such as borophosphosilicate glass (BPSG), fluorosilicate glass (FSG), phosphosilicate glass (PSG), boron doped silicate glass (BSG), and/or other suitable dielectric materials. In an embodiment, the dielectric layer 216 includes one or more oxide based dielectric materials such as silicon dioxide, tetraethylorthosilicate (TEOS) formed oxide, un-doped silicate glass, or doped silicon oxide such as borophosphosilicate glass (BPSG), fluorosilicate glass (FSG), phosphosilicate glass (PSG), boron doped silicon glass (BSG), and/or other suitable dielectric materials.

In the present embodiment, each MRAM cell 249 includes a bottom electrode (BE) 221. The BE 221 includes a bottom electrode via (BEVA) 220 and a conductive barrier layer 218 on sidewalls and a bottom surface of the BEVA 220. The BE 221 may include other layer(s) in alternative embodiments. The conductive barrier layer 218 may be disposed directly on one of the metal lines 208 in the metal layer 302, which is connected to a via on one of the source and drain features of the transistors in the transistor structure 101 (such connection is not shown in FIG. 1C, but see FIG. 1A). The BEVA 220 may include a magnetic material (such as a ferromagnetic material or other types of magnetic material) or a non-magnetic material such as tungsten, titanium, tantalum, tungsten nitride, titanium nitride, tantalum nitride, a combination thereof, or other suitable metal or metal compound. Examples of ferromagnetic materials include iron, nickel, cobalt, or their compounds. The barrier layer 218 may include a magnetic material (such as iron, nickel, cobalt, or their compounds) or a non-magnetic material such as titanium nitride, tantalum nitride, and/or other suitable conductive diffusion barrier. The barrier layer 218 is disposed between the BEVA 220 and the surrounding dielectric layers 210, 212, and 214. Having a magnetic material in the barrier layer 218, the BEVA 220, or both the barrier layer 218 and the BEVA 220 is effective in shielding the MTJ 150 against vertical external magnetic fields (i.e., magnetic fields that go up and down along the "z" direction).

In the present embodiment, each MRAM cell 249 further includes a bottom conductive hard mask (HM) 222 disposed on the BE 221, an MTJ (or MTJ stack) 150 disposed on the HM 222, and a top conductive HM 228 disposed on the MTJ 150. In an embodiment, each of the HM 222 and the HM 228 may include a metal nitride such as TaN, TiN, Ti/TiN, TaN/TiN, Ta or the combinations thereof. In some embodiments, the MTJ 150 may include ferromagnetic layers, MTJ spacers, and a capping layer. The capping layer is formed on the ferromagnetic layer. Each of the ferromagnetic layers may include ferromagnetic material, which may be metal or metal alloy, for example, Fe, Co, Ni, CoFeB, FeB, CoFe, FePt, FePd, CoPt, CoPd, CoNi, TbFeCo, CrNi or the like. The MTJ spacer may include non-ferromagnetic metal, for example, Ag, Au, Cu, Ta, W, Mn, Pt, Pd, V, Cr, Nb, Mo, Tc, Ru or the like. Another MTJ spacer may also include insulator, for example, Al$_2$O$_3$, MgO, TaO, RuO or the like. The capping layer may include non-ferromagnetic material, which may be a metal or an insulator, for example, Ag, Au, Cu, Ta, W, Mn, Pt, Pd, V, Cr, Nb, Mo, Tc, Ru, Ir, Re, Os, Al$_2$O$_3$, MgO, TaO, RuO or the like. The capping layer may reduce write current of its associated MRAM cell. The ferromagnetic layer may function as a free layer 152 (FIG. 1A) whose magnetic polarity or magnetic orientation can be changed during write operation of its associated MRAM cell 249. The ferromagnetic layers and the MTJ spacer may function as a fixed or pinned layer 154 (FIG. 1A) whose magnetic orientation may not be changed during operation of its associated MRAM cell 249. It is contemplated that the MTJ 150 may include an antiferromagnetic layer in accordance with other embodiments.

In the present embodiment, each MRAM cell 249 further includes a dielectric spacer 224 on sidewalls of the MTJ 150 and the HM 222. The spacer 224 may include one or more dielectric materials such as silicon oxide (SiO$_x$), silicon nitride (SiN$_x$), silicon oxynitride (Si$_x$O$_y$N$_z$), or the like. The protective spacer 226 is disposed over the dielectric spacers 224 and over the sidewalls of the HM 228 in the present embodiment. In embodiments, the dielectric spacer 224, the protective spacer 226, and the dielectric layer 216 surround the MTJ 150 by 360 degrees from a top view. In an embodiment, the dielectric spacer 224, the protective spacer 226, and the dielectric layer 216 are collectively referred to as a sidewall spacer of the MRAM cell 249. In some embodiments, the protective spacer 226 includes a magnetic material such as cobalt or NiFe. Having a magnetic material in the protective spacer 226 is effective in shielding the MTJ 150 from horizontal external magnetic fields (such as magnetic fields in the "xy" plane). In some embodiments, the protective spacer 226 includes a non-magnetic material, such as alumina ($Al_2O_3$).

In the present embodiment, the metal layer 304 in the logic region 100B includes the metal vias 213, the metal lines 217, and the dielectric layers 210 and 215. The metal vias 213 are electrically connected to some of the metal lines 208 in the metal layer 302. The dielectric layer 215 can be an oxide, such as silicon dioxide, a low-k dielectric material such as carbon doped oxides, or an extreme low-k dielectric material such as porous carbon doped silicon dioxide. The metal vias 213 and the metal lines 217 can be made of a metal, such as aluminum, copper, or combinations thereof.

The metal layer 306 includes conductive features (or conductive layers) 260 and 262 surrounded by one or more dielectric layers 230, 232, and 234. The dielectric layers 230, 232, and 234 extend across both the MRAM region 100A and the logic region 100B. The conductive features 260 and 262 in the MRAM region 100A are disposed on and electrically connected to one or more MTJs 150. The conductive features 260 and 262 in the logic region 100B are disposed on and electrically connected to one or more metal lines 217. The various components in the metal layer 306 are further described below.

In an embodiment, the dielectric layer 230 includes a material that is the same as or similar to the material(s) in the dielectric layer 210. For example, the dielectric layer 230 may include one or more dielectric materials such as $Si_3N_4$, SiON, SiC, SiCN, or a combination thereof. In an embodiment, the dielectric layer 232 includes a material that is the same as or similar to the material(s) in the dielectric layer 212. For example, the dielectric layer 232 may include a metal-based dielectric material, such as aluminum oxide (i.e., $AlO_x$ such as $Al_2O_3$) or other metal oxides. In an embodiment, the dielectric layer 234 includes a low-k dielectric material, such as a silicon oxide based low-k dielectric material. For example, the dielectric layer 234 may include un-doped silicate glass (USG), or doped silicon oxide such as borophosphosilicate glass (BPSG), fluorosilicate glass (FSG), phosphosilicate glass (PSG), boron doped silicate glass (BSG), and/or other suitable dielectric materials.

In the present embodiment, the conductive features 260 are metal vias and/or metal lines, and the conductive features 262 are barrier layers on sidewall and bottom surface of the conductive features 260. In an embodiment, the conductive features 260 include a magnetic material (such as iron, nickel, cobalt, or their compounds) or a non-magnetic material such as aluminum, copper, or combinations thereof. In an embodiment, the conductive features 262 include a magnetic material (such as iron, nickel, cobalt, or their compounds) or a non-magnetic material such as titanium nitride, tantalum nitride, and/or other suitable conductive diffusion barrier. Having a magnetic material in the conductive features 260, the conductive features 262, or both the conductive features 260 and 262 is effective in shielding the MTJ 150 from vertical external magnetic fields (i.e., magnetic fields that go up and down along the "z" direction).

In the present embodiment, the conductive features 260/262 in the MRAM region 100A are part of a bit line for the MRAM array 250. Each conductive feature 260 may be disposed over a column of MRAM cells 249 that share the same bit line (see FIG. 1B). In some embodiments, each conductive feature 260 is disposed over one MRAM cell 249 or a plurality of contiguous MRAM cells 249 (which may be a subset of a column of MRAM cells 249) that share the same bit line. In some embodiment, the conductive features 260/262 are disposed directly on and electrically connected to the conductive HM 228 of each MRAM cells 249 in a column. In some embodiments, the conductive features 260/262 are disposed directly on and electrically connected to the MTJ 150 of each MRAM cells 249 in a column, such as shown in FIGS. 2E, 2F, 2G, and 2H. In some embodiments, the conductive features 260/262 are also referred to as the top electrode (TE) 263 of the MRAM cell 249.

As discussed above, one or more of the layers/features 218, 220, 226, 260, and 262 may include a magnetic material such as cobalt, iron, nickel, or their compounds such as NiFe. This shields the MTJ 150 from external magnetic interference, such as magnetic interference coming from wireless chargers to cell phones which host the semiconductor device 200. In some embodiments, the semiconductor device 200 incorporates a magnetic material in at least one of the layers/features 218, 220, 226, 260, and 262. In some embodiments, the semiconductor device 200 incorporates a magnetic material in at least two of the layers/features 218, 220, 226, 260, and 262. For example, the semiconductor device 200 may include a magnetic material in one of the layers 218 and 220 and another magnetic material in the layer 226. This shields the MTJ 150 from interference by both vertical and horizontal external magnetic fields. Similarly, the semiconductor device 200 may include a magnetic material in one of the layers 260 and 262 and another magnetic material in the layer 226. In some embodiments, the semiconductor device 200 incorporates a magnetic material in at least three of the layers/features 218, 220, 226, 260, and 262. For example, the semiconductor device 200 may include a magnetic material in one of the layers 260 and 262, another magnetic material in the layer 226, and another magnetic material in one of the layers 218 and 220. This shields the MTJ 150 from interference by both vertical and horizontal external magnetic fields. In various embodiments, the magnetic materials in the layers/features 218, 220, 226, 260, and 262 may be the same or may be different.

Figure 2B:
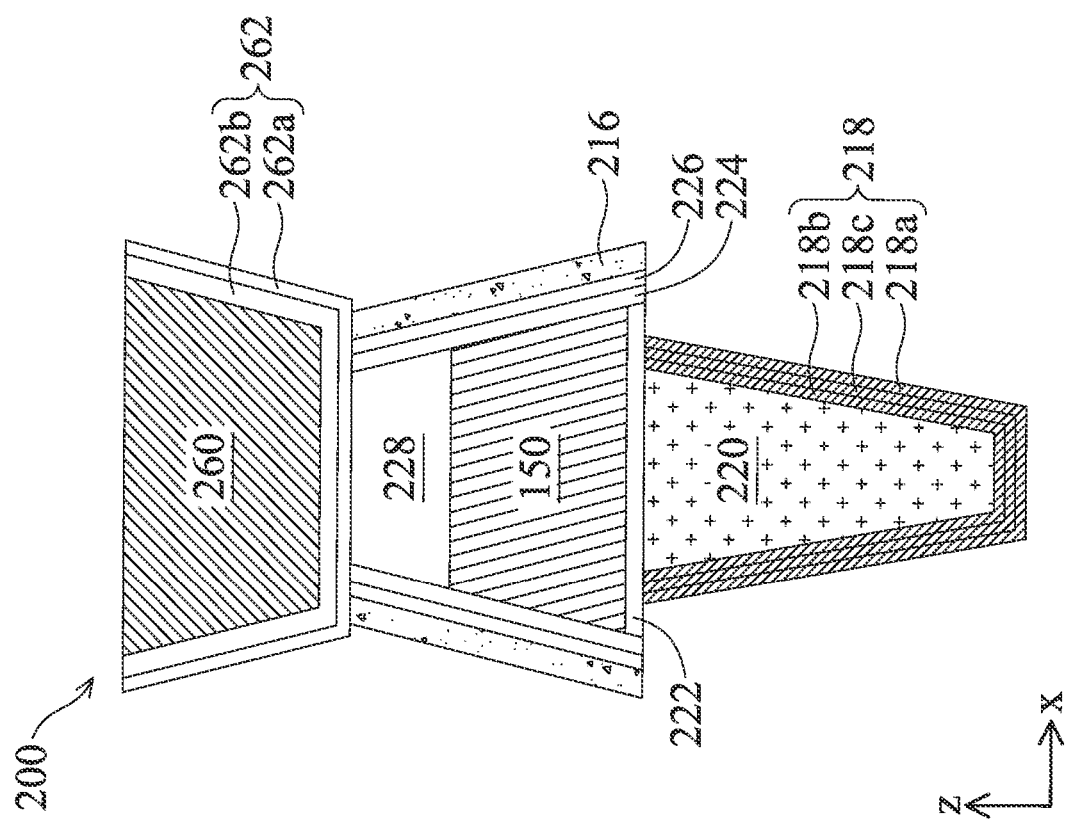
FIGS. 2A, 2B, 2C, 2D, 2E, 2F, 2G, and 2H illustrate cross-sectional views of a portion of the semiconductor device in FIGS. 1A-1C, in accordance with various embodiments.
Figure 2A:
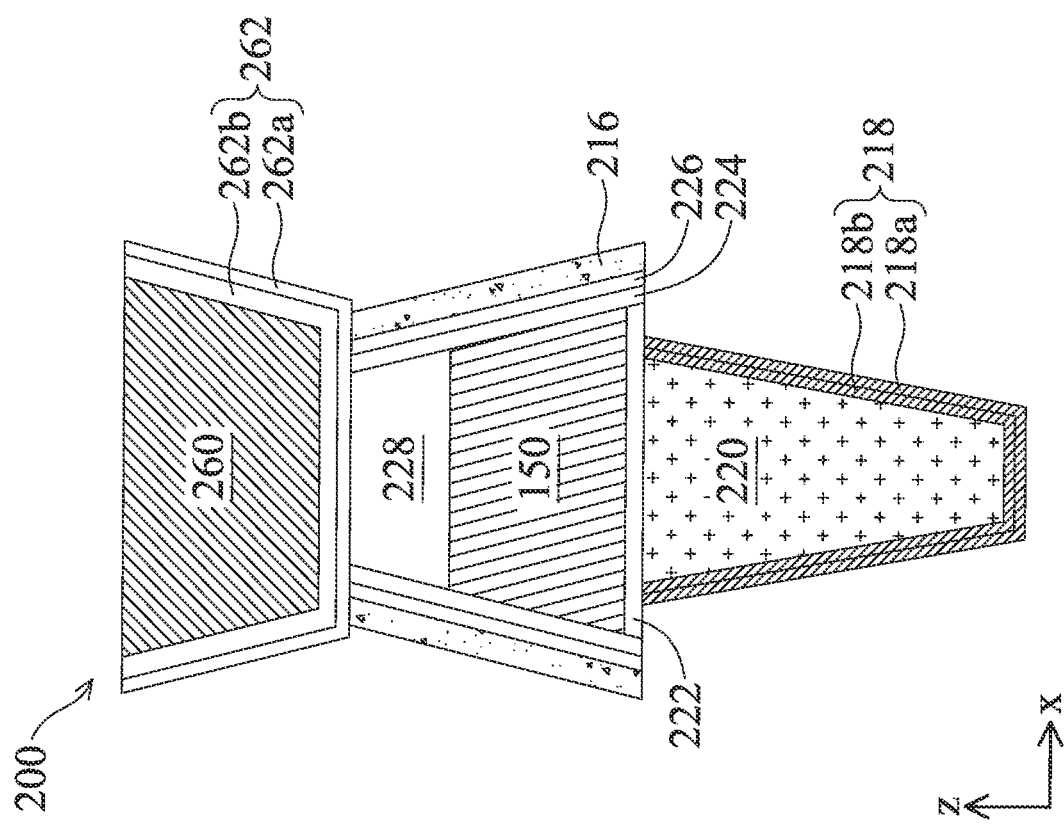

FIGS. 2A through 2H further illustrate various non-limiting examples of the device 200 where a magnetic material is included in one or more of the layers/features 218, 220, 226, 260, and 262. Referring to FIG. 2A, in this embodiment, the barrier layer 218 includes a sublayer 218b over a sublayer 218a. In an embodiment, the sublayer 218a includes TaN and the sublayer 218b includes TiN. The protective spacer 226 includes a magnetic material such as Co, NiFe, or a combination thereof. The protective spacer 226 is sandwiched between the dielectric spacers 224 and 216. In an example, the dielectric spacer 224 includes a nitride such as silicon nitride ($Si_3N_4$) and the dielectric spacer (or layer) 216 includes an oxide such as silicon dioxide. Further, the barrier layer 262 includes a sublayer 262b over a sublayer 262a. In an embodiment, the sublayer 262a includes Ta and the sublayer 262b includes TaN. In an embodiment, the BEVA 220 includes tungsten and the conductive feature 260 includes copper.

Referring to FIG. 2B, in this embodiment, the barrier layer 218 includes a sublayer 218b over a sublayer 218c that is over a sublayer 218a. In an embodiment, the sublayer 218a includes TaN, the sublayer 218b includes TiN, and the sublayer 218c includes a magnetic material such as Co. In an embodiment, the BEVA 220 includes a magnetic material such as Co. In an alternative embodiment, the BEVA 220 includes a non-magnetic material such as tungsten. In an embodiment, the protective spacer 226 includes a magnetic material such as Co, NiFe, or a combination thereof. In an alternative embodiment, the protective spacer 226 includes a non-magnetic material such as $Al_2O_3$. Other aspects of the embodiment in FIG. 2B are the same as those of the embodiment in FIG. 2A.

Figure 2C:
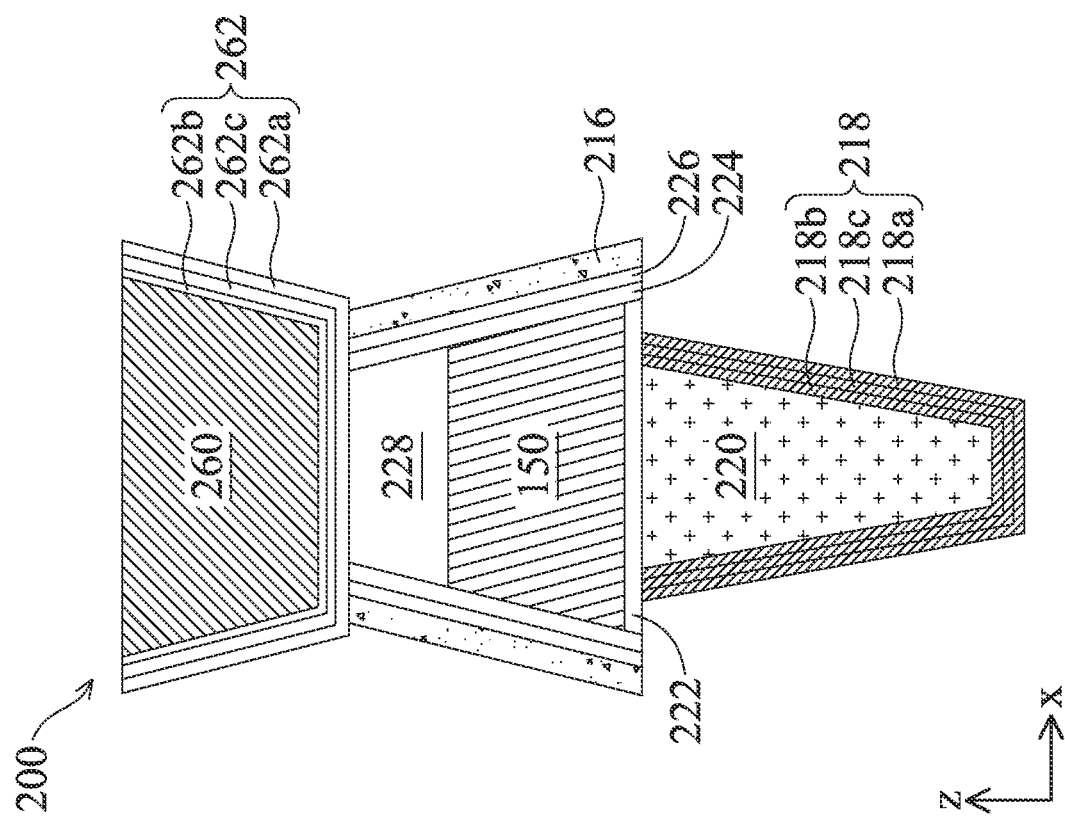

Referring to FIG. 2C, in this embodiment, the barrier layer 262 includes a sublayer 262b over a sublayer 262c that is over a sublayer 262a. In an embodiment, the sublayer 262a includes Ta, the sublayer 262b includes TaN, and the sublayer 262c includes a magnetic material such as Co. In an embodiment, the conductive layer 260 includes a magnetic material such as Co. In an alternative embodiment, the conductive layer 260 includes a non-magnetic material such as copper. In an embodiment, the protective spacer 226 includes a magnetic material such as Co, NiFe, or a combination thereof. In an alternative embodiment, the protective spacer 226 includes a non-magnetic material such as $Al_2O_3$. Other aspects of the embodiment in FIG. 2C are the same as those of the embodiment in FIG. 2A.

Figure 2D:
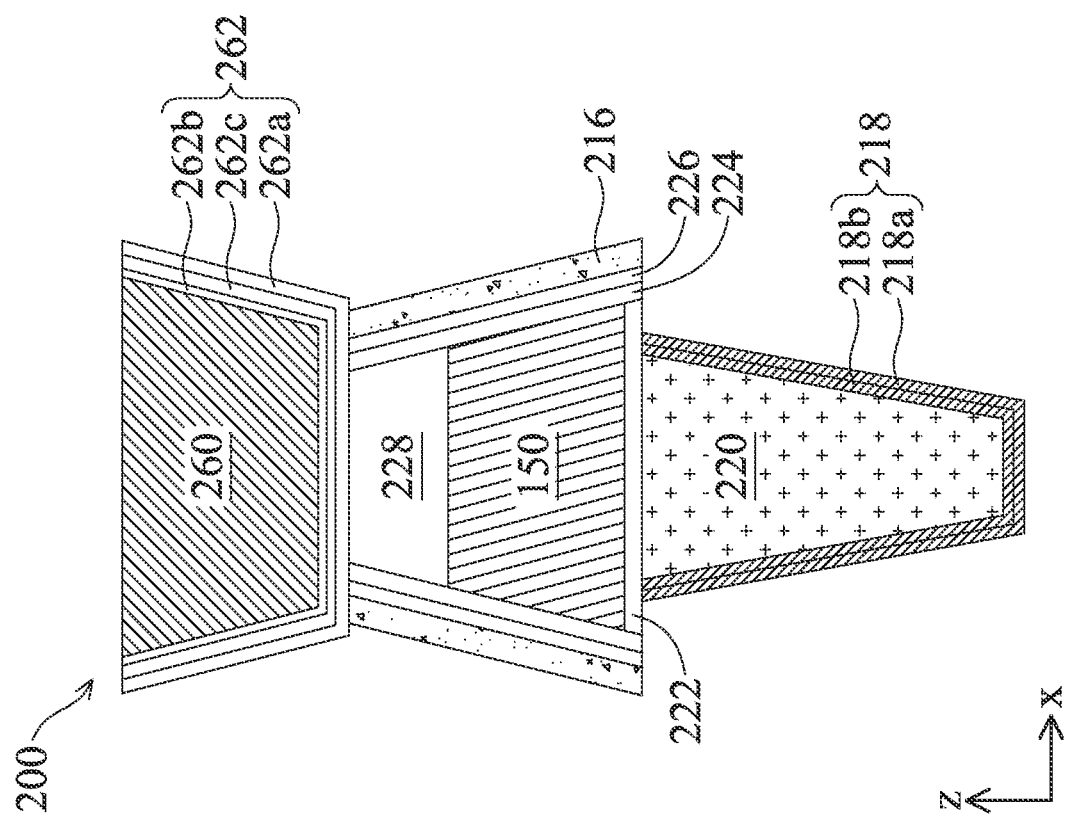
Figure 2E:
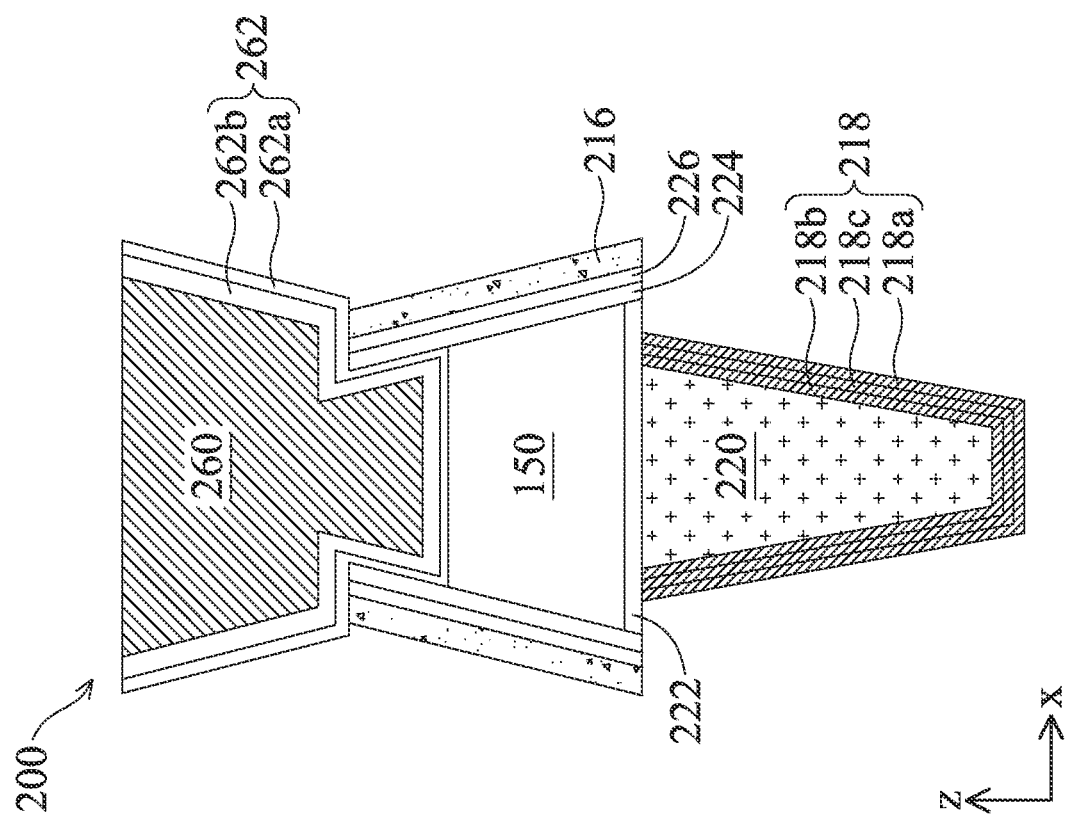
Figure 2F:
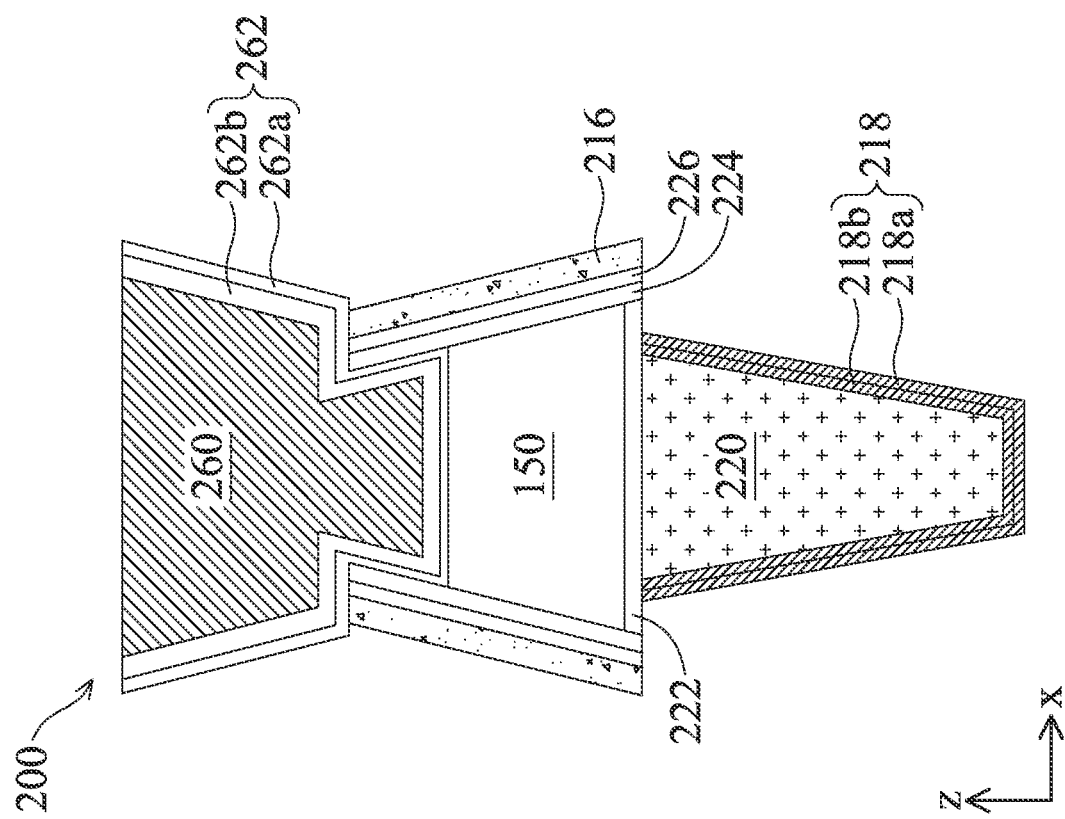
Figure 2H:
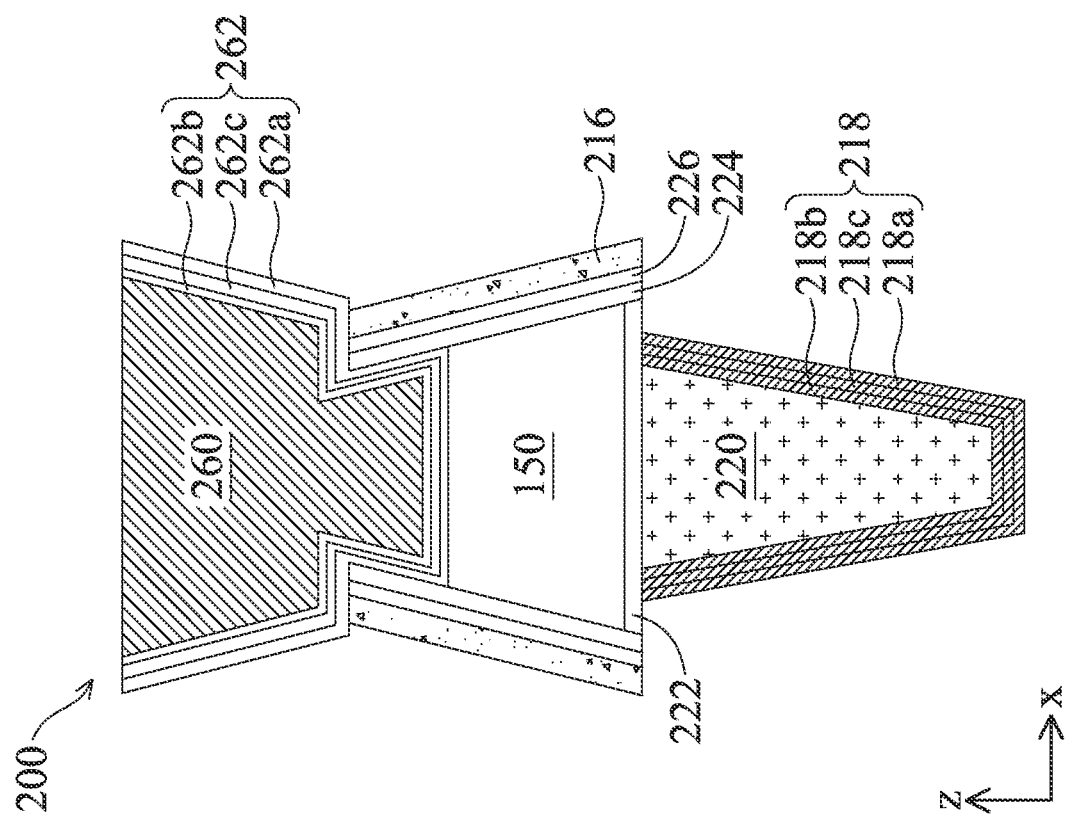
Figure 2G:
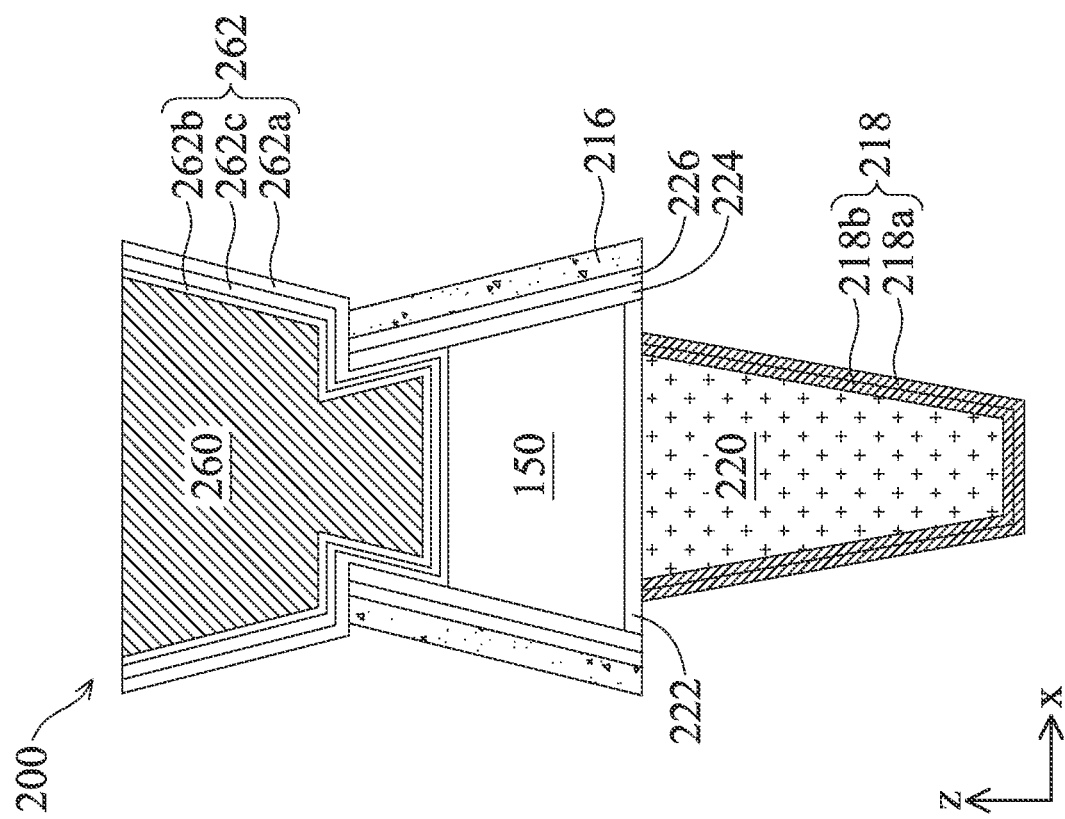

Referring to FIG. 2D, in this embodiment, the barrier layer 218 includes a sublayer 218b over a sublayer 218c that is over a sublayer 218a. Further, the barrier layer 262 includes a sublayer 262b over a sublayer 262c that is over a sublayer 262a. In an embodiment, the sublayer 218a includes TaN, the sublayer 218b includes TiN, the sublayer 218c includes a magnetic material such as Co, the sublayer 262a includes Ta, the sublayer 262b includes TaN, the sublayer 262c includes a magnetic material such as Co, and the protective spacer 226 includes a magnetic material such as Co, NiFe, or a combination thereof. Thus, the MTJ 150 is surrounded (on its sidewalls and top and bottom surfaces) by magnetic materials. In a further embodiment, each of the BEVA 220 and the conductive layer 260 additionally includes a magnetic material such as Co.

The embodiments shown in FIGS. 2E, 2F, 2G, and 2H are substantially same as the embodiments shown in FIGS. 2A, 2B, 2C, and 2D, respectively, except that the top HM 228 is removed in the embodiments shown in FIGS. 2E, 2F, 2G, and 2H and the conductive layers 260/262 extend to the space previously occupied by the top HM 228. In the embodiments shown in FIGS. 2E, 2F, 2G, and 2H, the barrier layer 262 directly contacts the MTJ 150.

Figure 3A:
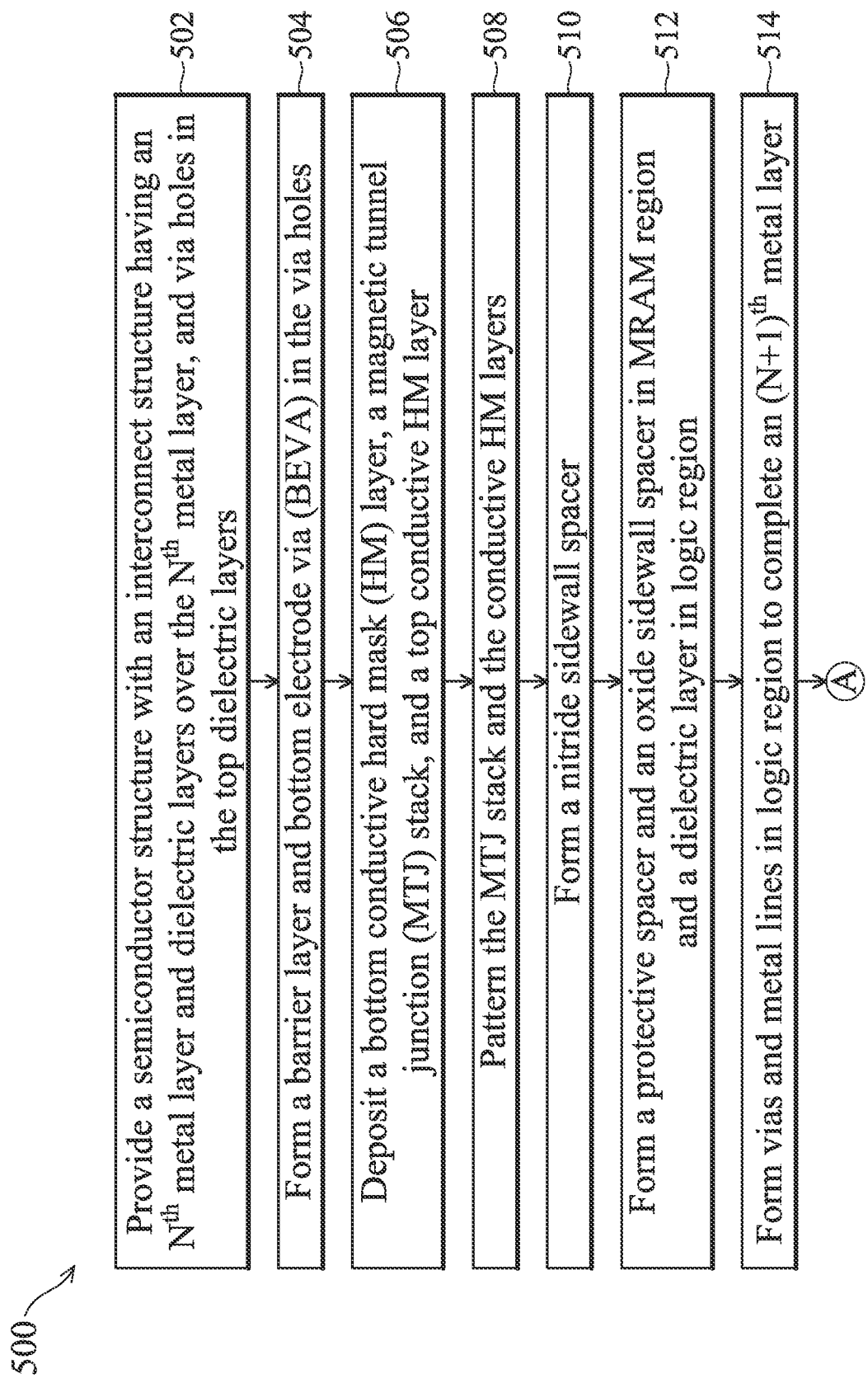
FIGS. 3A and 3B show a flow chart of a method for forming a semiconductor device with an MRAM array integrated therein, according to an embodiment of the present disclosure.
Figure 3B:
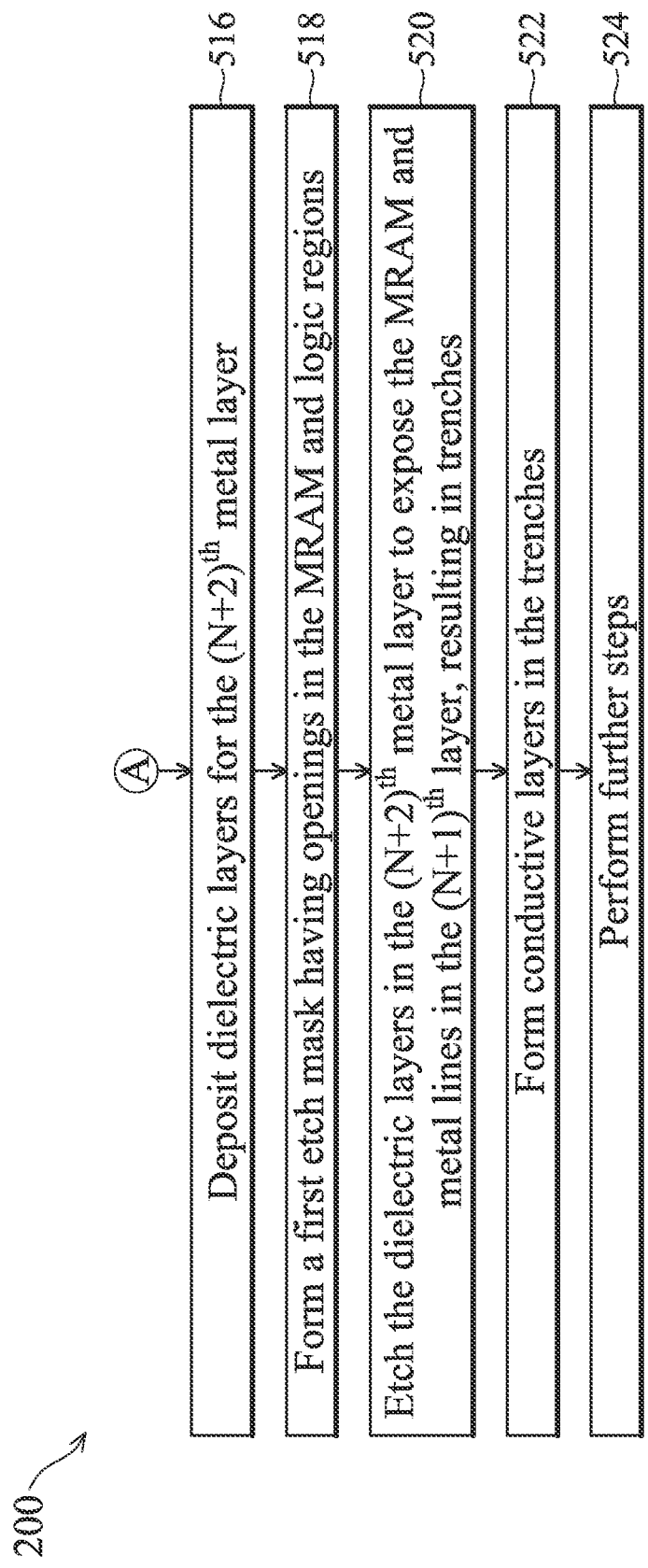

FIGS. 3A and 3B illustrate a flow chart of a method 500 for forming the semiconductor device 200 having an MRAM array and logic devices integrated in accordance with an embodiment. The method 500 is merely an example, not intended to limit the present disclosure beyond what is explicitly recited in the claims. Additional operations can be provided before, during, and after the method 500, and some operations described can be replaced, eliminated, or relocated for additional embodiments of the method. The method 500 is described below in conjunction with FIG. 4A through FIG. 4N-1, which illustrate various cross-sectional views of the semiconductor device 200 during fabrication steps according to the method 500.

At operation 502, the method 500 (FIG. 3A) provides, or is provided with, a device structure 200 having a metal layer 302 and various dielectric layers 210, 212, and 214 disposed over the metal layer 302, such as shown in FIG. 4A. Although not shown in FIG. 4A, the device structure 200 further includes a transistor structure (such as the transistor structure 101 in FIG. 1C) disposed in or on a substrate (such as the substrate 100 in FIG. 1C). The metal layer 302 is the $N^{th}$ metal layer above the transistor structure, where N is a natural number. The device structure 200 includes an MRAM region 100A for forming an MRAM array therein and a logic region 100B for forming logic devices therein. The metal layer 302 includes an IMD layer 206 and metal lines 208 in both the MRAM region 100A and the logic region 100B. The IMD layer 206 can be an oxide, such as silicon dioxide, a low-k dielectric material such as carbon doped oxides, or an extreme low-k dielectric material such as porous carbon doped silicon dioxide. The metal lines 208 can be made of a metal, such as aluminum, copper, or combinations thereof. The IMD layer 206 may be formed by deposition process, such as physical vapor deposition (PVD) or chemical vapor deposition (CVD) including plasma enhanced chemical vapor deposition (PECVD). The metal lines 208 may be formed by a deposition process such as PVD, CVD, ALD, or a plating process. In an embodiment, the dielectric layer 210 may include one or more dielectric materials such as $Si_3N_4$, SiON, SiC, SiCN, or a combination thereof, and may be deposited using PVD, CVD, ALD, or other suitable processes to a thickness in a range of about 12 nm to about 20 nm. In an embodiment, the dielectric layer 212 includes a metal-based dielectric material, such as aluminum oxide, and may be deposited using CVD, ALD, or other suitable processes to a thickness in a range of about 2 nm to about 6 nm. In an embodiment, the dielectric layer 214 includes a silicon oxide based dielectric material such as un-doped silicate glass (USG), and may be deposited using CVD, PVD, or other suitable processes to a thickness in a range of about 40 nm to about 100 nm. Still referring to FIG. 4A, via holes 219 are formed into the dielectric layers 214, 212, and 210 to expose top surface of the metal lines 208 and the IMD layer 206. The via holes 219 may be formed using a variety of processes including photolithography processes and etching processes. For example, a photolithography process may be used to form an etch mask, the dielectric layers 214, 212, and 210 are etched through the etch mask to form the via holes 219, and the etch mask is removed thereafter.

At operation 504, the method 500 (FIG. 3A) forms BEVA 220 and barrier layer 218 in the via holes 219 and electrically connected to some of the metal lines 208 in the MRAM region 100A, such as shown in FIG. 4B. For example, the operation 504 deposits the barrier layer 218 on the surfaces of the via holes 219 and deposits the BEVA 220 over the barrier layer 218. Thereafter, the operation 504 may perform a chemical mechanical planarization (CMP) process to the BEVA 220 and the barrier layer 218, thereby removing any excessive materials on the top surface of the dielectric layer 214. The barrier layer 218 may include a magnetic material such as Co or a non-magnetic material such as titanium nitride, tantalum nitride, or other suitable conductive diffusion barrier, and may be deposited using ALD, PVD, CVD, or other suitable deposition methods. The BEVA 220 may include a magnetic material such as Co or a non-magnetic material such as tungsten, titanium, tantalum, tungsten nitride, titanium nitride, tantalum nitride, a combination thereof, or other suitable metal or metal compound, and may be deposited using CVD, PVD, ALD, plating, or other suitable deposition methods.

At operation 506, the method 500 (FIG. 3A) deposits a bottom conductive HM layer 222, an MTJ stack 150, and a top conductive HM layer 228 over the dielectric layer 214, the barrier layer 218, and the BEVA 220, such as shown in FIG. 4C. Particularly, the HM layer 222 electrically connects to the BEVA 220. In an embodiment, the HM layer 222 may include a metal nitride such as TaN, TiN, Ti/TiN, TaN/TiN, Ta, or a combination thereof, and may be deposited using CVD, ALD, or other suitable deposition methods. The HM layer 222 may be formed to have a thickness in a range about 1 nm to about 8 nm in some embodiments. The MTJ stack 150 may be deposited using CVD, PVD, ALD, or other suitable deposition methods, and may have a thickness in a range of about 20 nm to about 50 nm in some embodiments. In an embodiment, the HM layer 228 may include a metal nitride such as TaN, TiN, Ti/TiN, TaN/TiN, Ta, or a combination thereof, and may be deposited using CVD, ALD, or other suitable deposition methods. The HM layer 228 may be formed to have a thickness in a range about 10 nm to about 25 nm in some embodiments.

At operation 508, the method 500 (FIG. 3A) patterns the HM layer 222, the MTJ stack 150, and the HM layer 228 into individual MRAM cells 249. For example, using photolithography and etching processes, the operation 508 may form an etch mask 402 that covers the areas of the HM layer 228 that correspond to individual MRAM cells 249 and exposes the rest of the HM layer 228, such as shown in FIG. 4D. Then, the operation 508 etches the HM layer 228, the MTJ stack 150, the HM layer 222, and the dielectric layer 214 through the etch mask 402 to form individual MRAM cells 249, such as shown in FIG. 4E. The etching process may be wet etching, dry etching, reactive ion etching, or other suitable etching methods. The etch mask 402 is removed thereafter, using etching, stripping, ashing, or other suitable methods.

At operation 510, the method 500 (FIG. 3A) forms a dielectric spacer 224 over the sidewalls of the MRAM cells 249, such as shown in FIG. 4F. In some embodiments, the spacer 224 is considered part of the MRAM cells 249. For example, the operation 510 may deposit a blanket dielectric layer over the device structure 200 in both the MRAM region 100A and the logic region 100B using CVD, ALD, or other suitable methods, then anisotropically etch the blanket dielectric layer to remove it from the top surface of the dielectric layer 214 and from the top surface of the HM 228. Portions of the dielectric layer remain on sidewalls of the MRAM cells 249, becoming the spacer 224. The spacer 224 may include one or more dielectric materials such as silicon oxide ($SiO_x$), silicon nitride ($SiN_x$), silicon oxynitride ($Si_xO_yN_z$), or the like. The spacer 224 may include one or multiple layers of the dielectric materials in various embodiments.

Figure 4G:
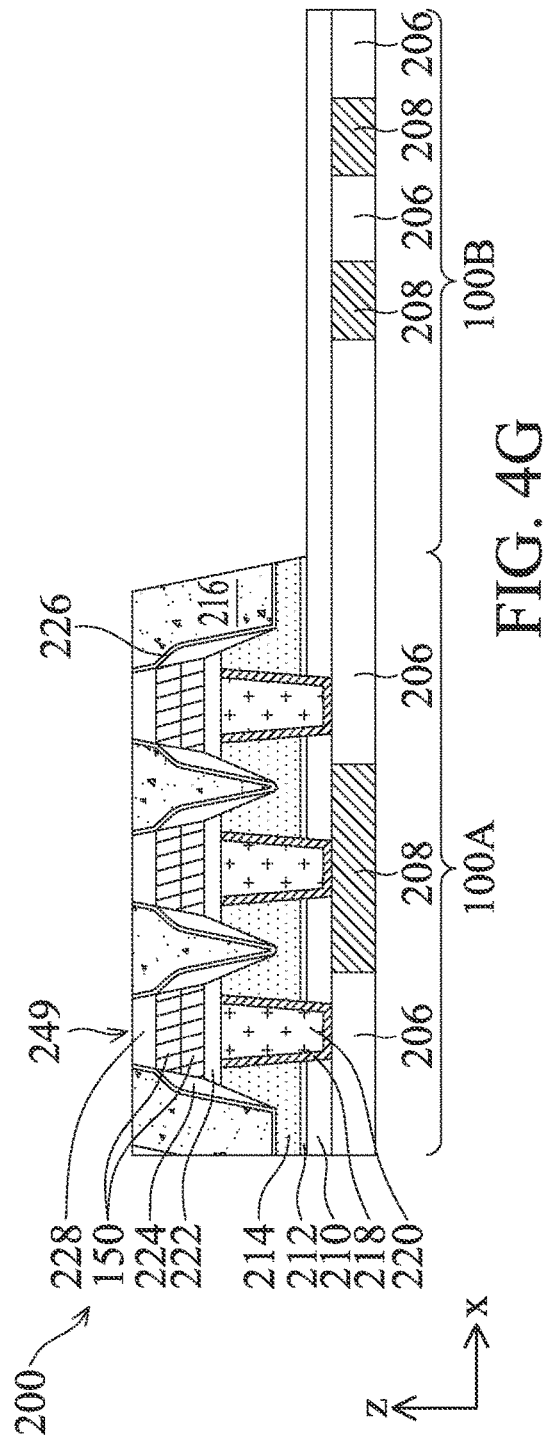

At operation 512, the method 500 (FIG. 3A) forms a protective spacer (or protective layer) 226 over the dielectric spacer 224 and the dielectric layer 214 and forms a dielectric layer (or another dielectric spacer) 216 over the protective spacer 226 in the MRAM region 100A, such as shown in FIG. 4G. For example, the operation 512 may deposit the protective spacer 226 and the dielectric layer 216 in both the MRAM region 100A and the logic region 100B; form an etch mask using photolithography and etching processes where the etch mask covers the MRAM region 100A and exposes the logic region 100B; etch the protective spacer 226 and the dielectric layers 216, 214, and 212 through the etch mask until the dielectric layer 210 is exposed in the logic region 100B; and remove the etch mask. The protective spacer 226 may be deposited using CVD, ALD, or other suitable methods. The dielectric layer 216 may be deposited using CVD, PVD, or other suitable methods. The protective spacer 226 and the dielectric layers 216, 214, and 212 may be etched using wet etching, dry etching, reactive ion etching, or other suitable methods. In embodiments, the protective spacer 226 may include a magnetic material such as Co or NiFe or a non-magnetic material such as $Al_2O_3$.

Figure 4H:
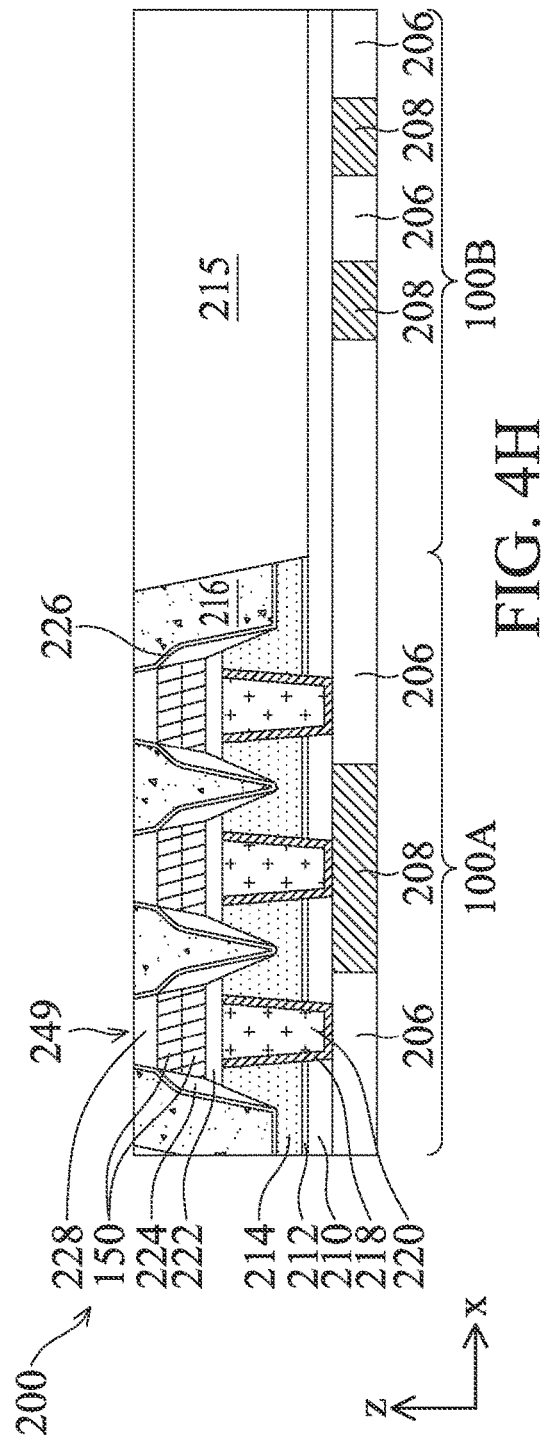

After the protective spacer 226 and the dielectric layers 216, 214, and 212 are etched, the operation 512 further forms a dielectric layer 215 in the logic region 100B, such as shown in FIG. 4H. The dielectric layer 215 can be an oxide, such as silicon dioxide, a low-k dielectric material such as carbon doped oxides, or an extreme low-k dielectric material such as porous carbon doped silicon dioxide. The dielectric layer 215 may be deposited using CVD, PVD, or other suitable methods. The operation 512 further performs a CMP process to planarize the top surfaces of the dielectric layers 215 and 216, the protective spacer 226, and the HM 228.

Figure 4I:
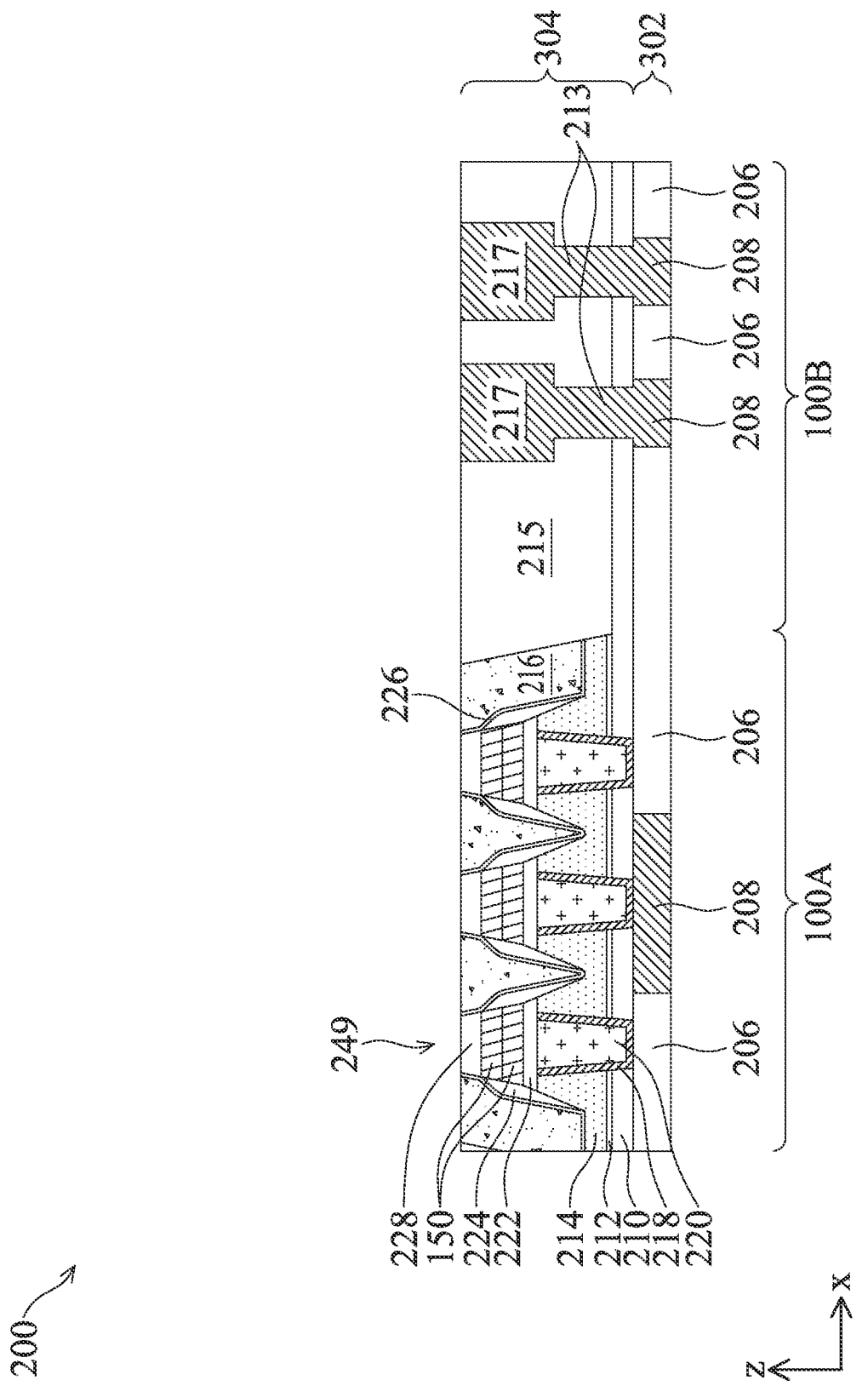

At operation 514, the method 500 (FIG. 3A) forms metal vias 213 and metal lines 217 in the logic region 100B, such as shown in FIG. 4I. The metal vias 213 and metal lines 217 may be formed using damascene process, dual damascene process, or other suitable methods. For example, the operation 514 may etch holes and/or trenches in the dielectric layer 215 to expose the top surface of the metal lines 208, deposit one or more metals into the holes and/or trenches, and perform a CMP process to the one or more metals. Portions of the one or more metals remaining in the holes and/or trenches become the metal vias 213 and metal lines 217. The metal vias 213 and the metal lines 217 may include aluminum, copper, or other suitable low resistance metals, and may be deposited using PVD, CVD, ALD, plating, or other suitable methods. After the operation 514 finishes, the top surface of the metal lines 217 are substantially coplanar with the top surface of the HM 228. Using the operations 504 through 514, the metal layer 304 is formed over the metal layer 302.

Figure 4J:
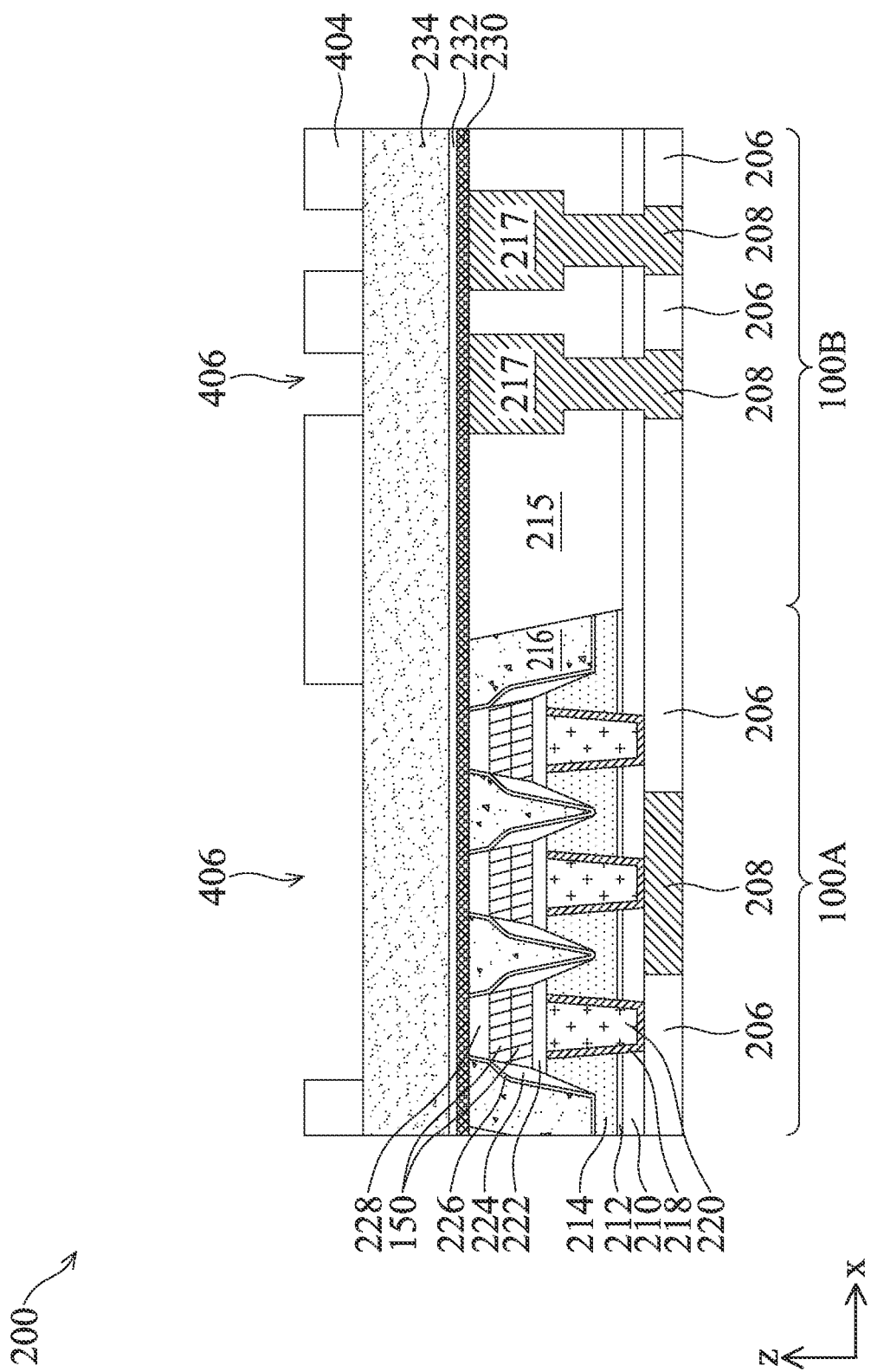

At operation 516, the method 500 (FIG. 3B) deposits dielectric layers 230, 232, and 234 over the metal layer 304 in both the MRAM region 100A and the logic region 100B, such as shown in FIG. 4J. In an embodiment, the dielectric layer 230 may include one or more dielectric materials such as a nitride (for example, silicon nitride) or silicon carbide, and may be deposited using ALD, CVD, PVD, or other suitable methods. The dielectric layer 230 may have a thickness in a range about 10 nm to about 15 nm in some embodiments. In an embodiment, the dielectric layer 232 may include a metal-based dielectric material, such as aluminum oxide (i.e., $AlO_x$ such as $Al_2O_3$), and may be deposited using ALD, CVD, PVD, or other suitable methods. The dielectric layer 232 may have a thickness in a range about 4 nm to about 10 nm in some embodiments. In an embodiment, the dielectric layer 234 may include un-doped silicate glass (USG), or doped silicon oxide such as borophosphosilicate glass (BPSG), fluorosilicate glass (FSG), phosphosilicate glass (PSG), boron doped silicate glass (BSG), and/or other suitable dielectric materials, and may be deposited using CVD, PVD, or other suitable methods. The dielectric layer 234 may have a thickness in a range about 40 nm to about 100 nm in some embodiments.

At operation 518, the method 500 (FIG. 3B) forms an etch mask 404 over the dielectric layer 234, such as shown in FIG. 4J. The etch mask 404 provides openings 406 over the MRAM region 100A and the logic region 100B. In an embodiment, the etch mask 404 includes a material that has etch selectivity with respect to the dielectric layers 234, 232, and 230 in an etching process. For example, the etch mask 404 may include a resist pattern and may further include a patterned hard mask under the resist pattern in an embodiment. For example, the patterned hard mask may include titanium nitride and may have a thickness in a range of about 10 nm to about 40 nm in an embodiment. The operation 518 may include depositing a hard mask layer over the dielectric layer 234, coating a photoresist over the hard mask layer, performing photolithography (such as exposing and developing) to the photoresist layer to form a resist pattern, and etching the hard mask layer through the resist pattern to form a patterned hard mask. The patterned hard mask and the resist pattern collectively form the etch mask 404.

Figure 4K:
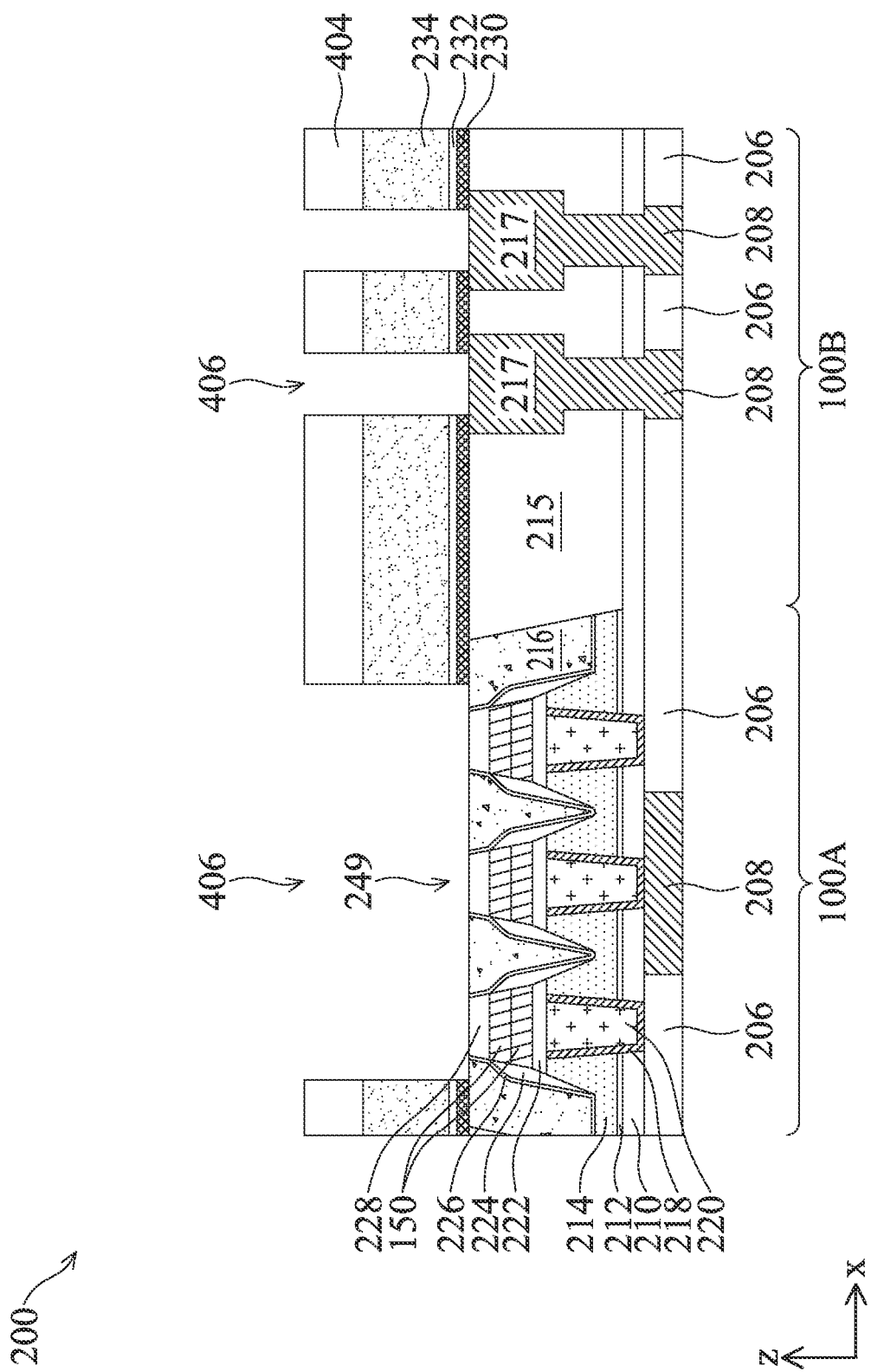
Figures 1, 4K:
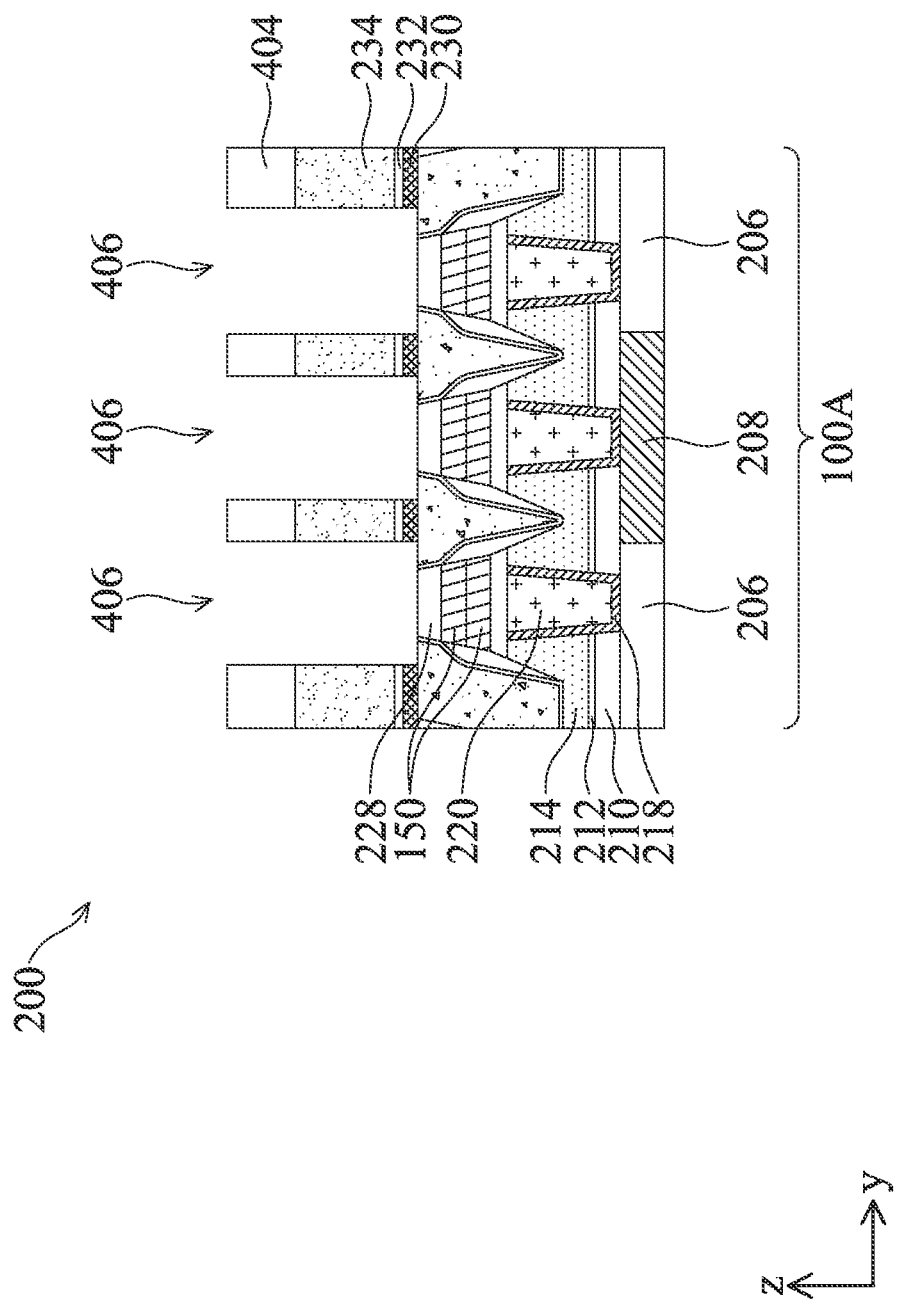

At operation 520, the method 500 (FIG. 3B) etches the dielectric layers 234, 232, and 230 through the etch mask 404 to expose the MRAM cells 249 in the MRAM region 100A and the metal lines 217 in the logic region 100B. FIGS. 4K and 4K-1 illustrate a resultant structure 200 according to an embodiment. FIG. 4K illustrates the structure 200 along the B-B line in FIG. 1B (i.e., along the "x" direction), and FIG. 4K-1 illustrates the structure 200 along the A-A line in FIG. 1B (i.e., along the "y" direction perpendicular to the "x" direction). In an embodiment, the operation 520 may perform multiple etching processes that are designed to etch each of the dielectric layers 234, 232, and 230 separately. For example, the operation 520 may perform a first etching process that is designed to etch the dielectric layer 234 with minimal or no etching to the etch mask 404, perform a second etching process that is designed to etch the dielectric layer 232 with minimal or no etching to the etch mask 404, and perform a third etching process that is designed to etch the dielectric layer 230 with minimal or no etching to the etch mask 404. The multiple etching processes may include wet etching, dry etching, or a combination of wet etching and dry etching. In some embodiments, an etching process in the operation 520 may etch more than one dielectric layer.

Figure 4L:
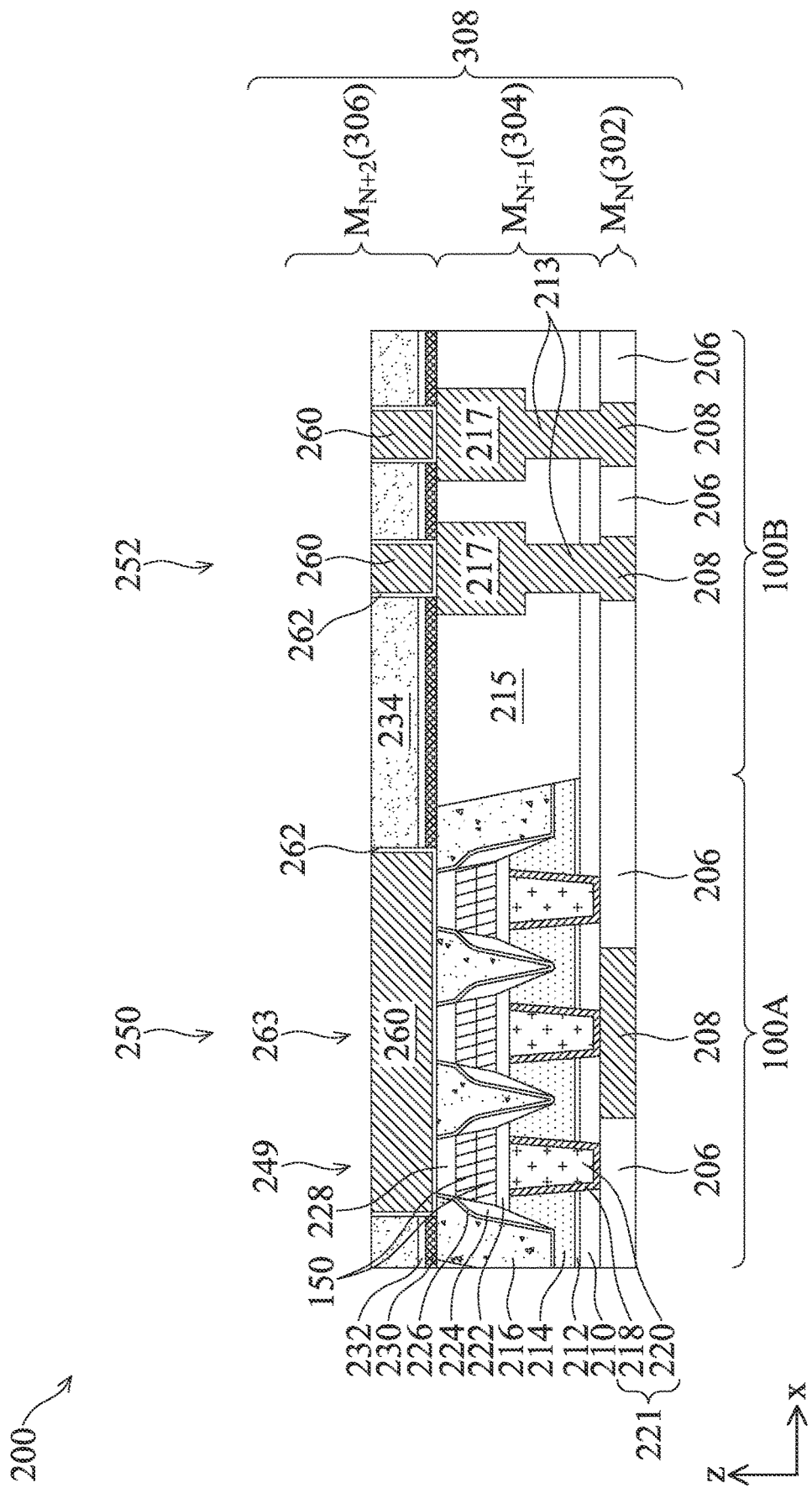
Figures 1, 4L:
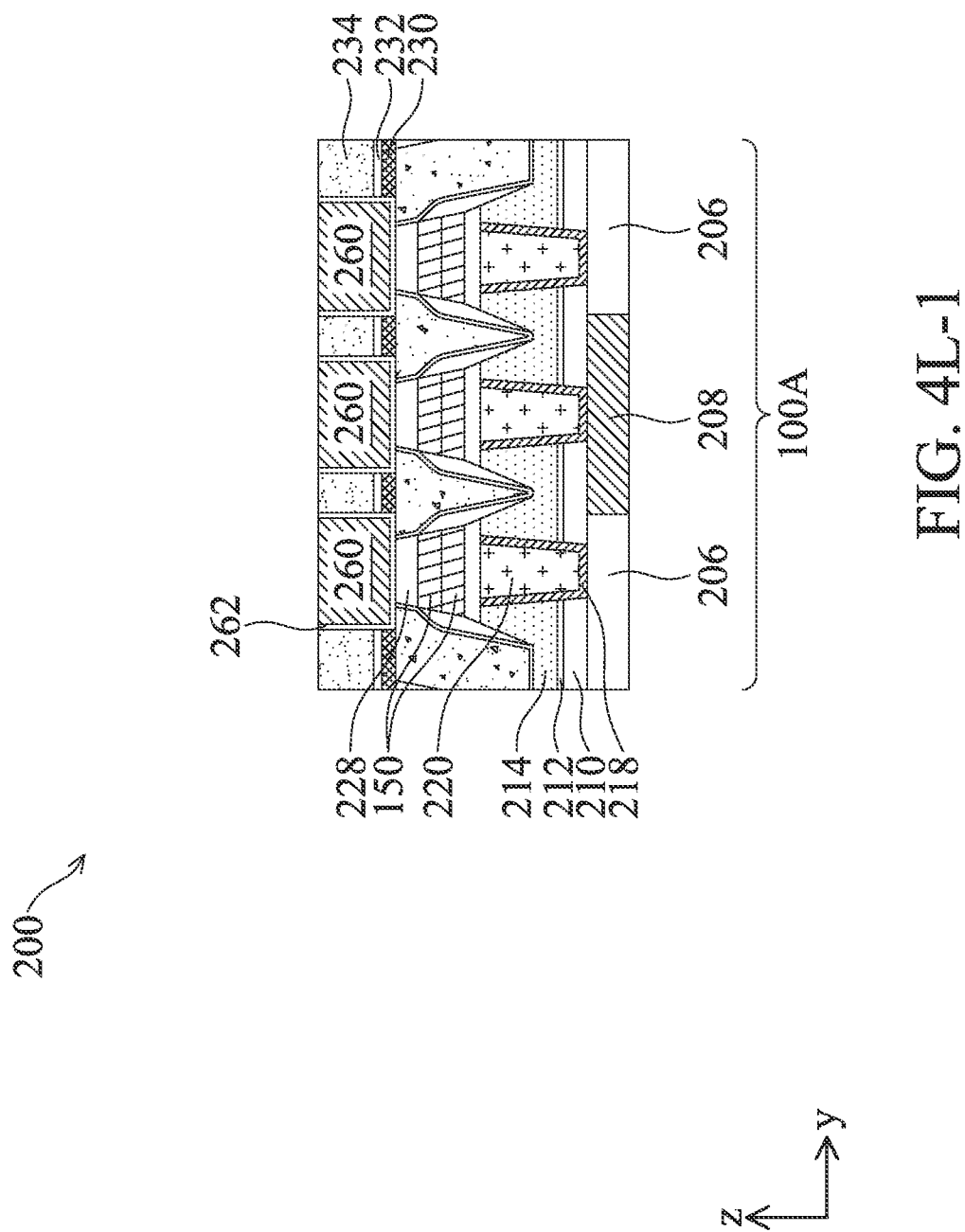
Figure 4M:
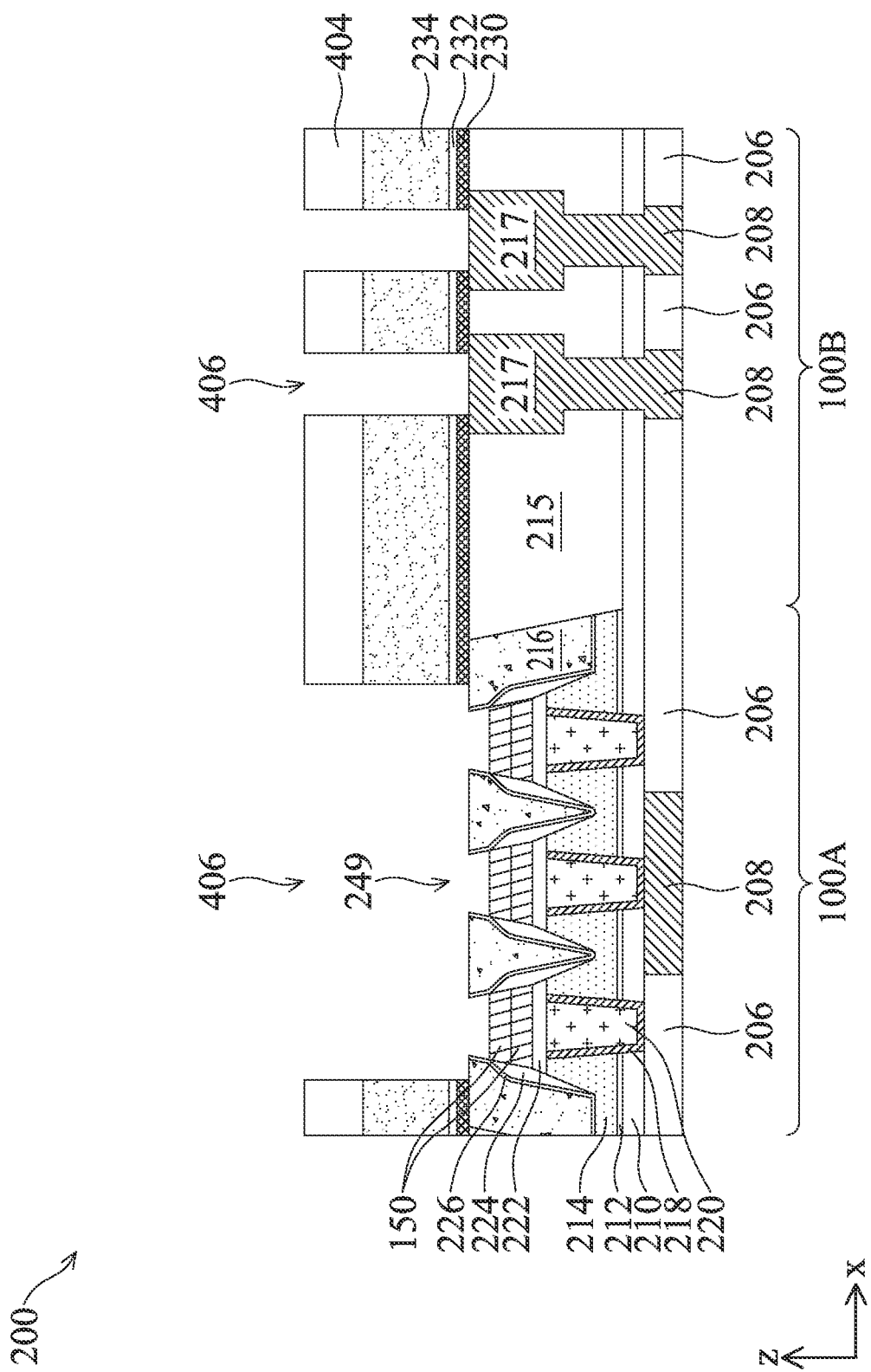
Figures 1, 4M:
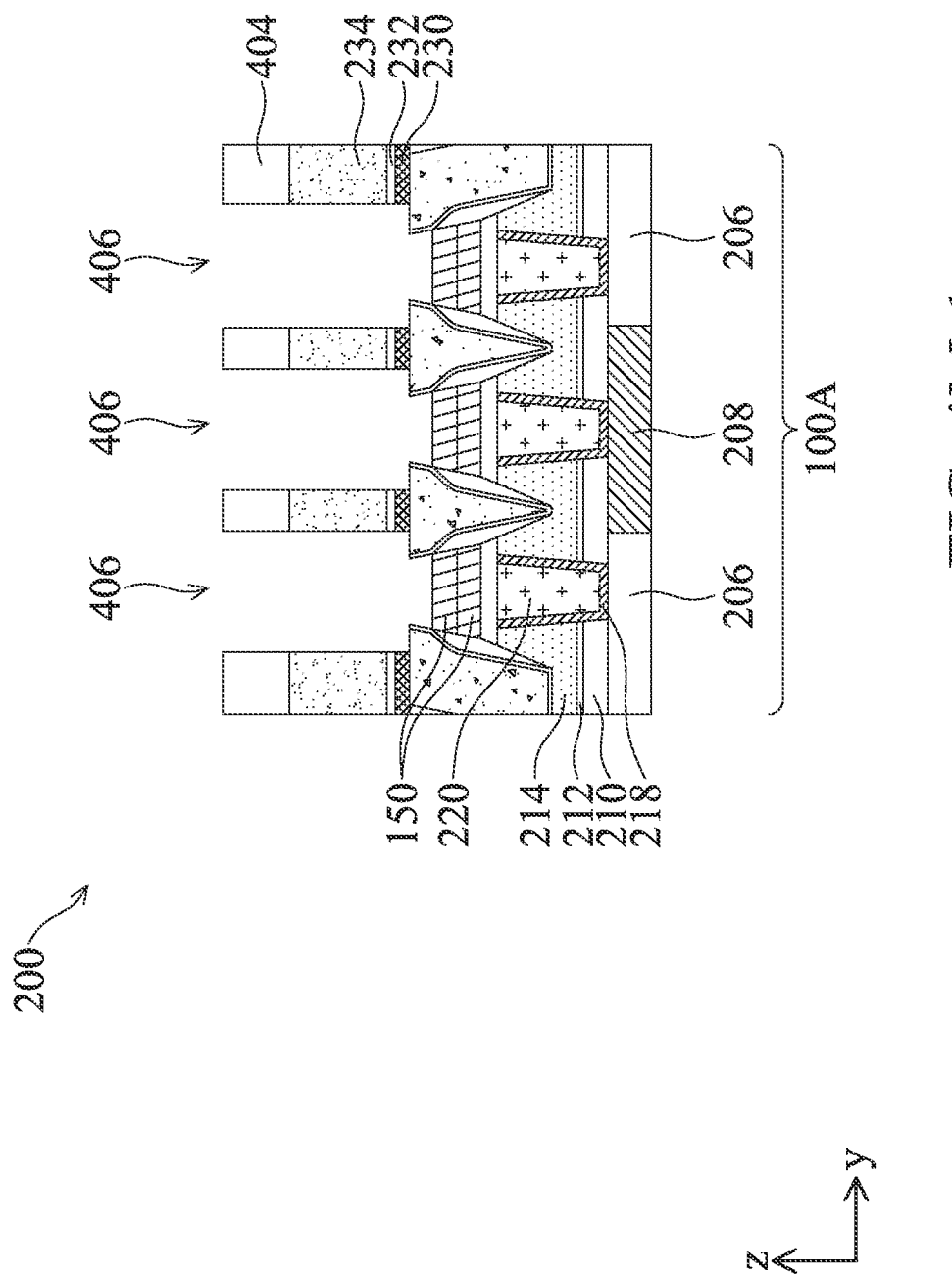

In some alternative embodiments, the HM 228 is also etched and the top surface of the MTJ 150 is exposed, such as shown in FIGS. 4M and 4M-1 that illustrate the structure 200 along the B-B line and the A-A line in FIG. 1B respectively. As shown in FIGS. 4K, 4K-1, 4M, and 4M-1, the operation 520 extends the openings 406 into the dielectric layers 234/232/230 to expose the MRAM cells 249 and the metal lines 217. Subsequently, the etch mask 404 may be removed.

Figure 4N:
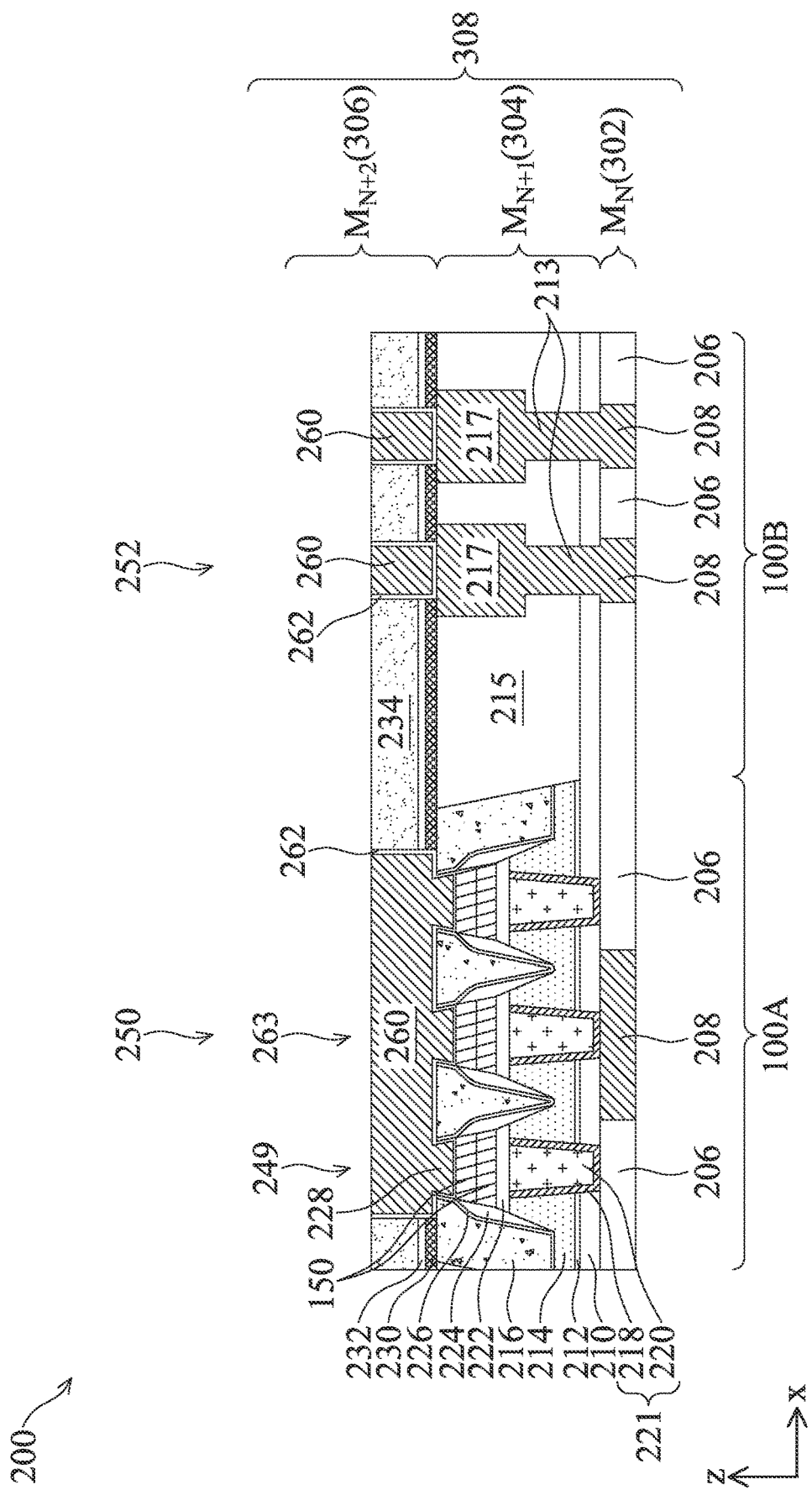
Figures 1, 4N:
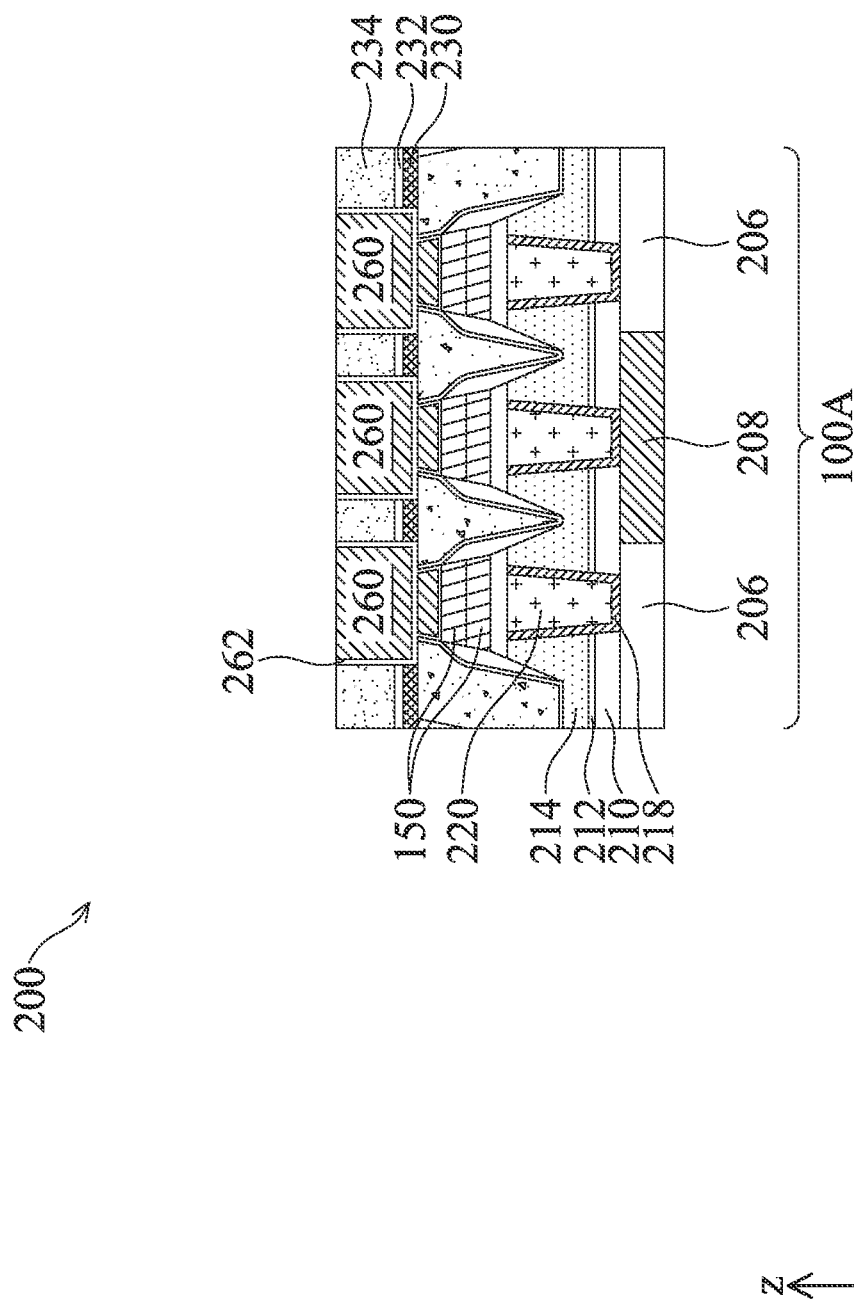

At operation 522, the method 500 (FIG. 3B) form conductive layers 262 and 260 in the openings 406. For example, the operation 522 may deposit one or more barrier layers 262 into the openings 406 and deposit one or more metallic materials 260 over the barrier layers 262 and into the openings 406, such as shown in FIGS. 4L and 4L-1 that illustrate the structure 200 along the B-B line and the A-A line in FIG. 1B respectively. In embodiments where the HM 228 is partially or completely removed by the operation 520 (such as shown in FIGS. 4M and 4M-1), the layers 260 and 262 also fill the space directly above the MTJ 150 and between the protection spacer 226 on two opposing sidewalls of the MRAM cell 249, such as shown in FIGS. 4N and 4N-1 that illustrate the structure 200 along the B-B line and the A-A line in FIG. 1B respectively. In an embodiment, the conductive layer 260 includes a magnetic material (such as cobalt) or a non-magnetic material such as aluminum, copper, or combinations thereof. In an embodiment, the conductive layer 262 include a magnetic material (such as cobalt) or a non-magnetic material such as titanium nitride, tantalum nitride, and/or other suitable conductive diffusion barrier. The conductive layers 262 and 260 may be deposited using CVD, PVD, ALD, plating, or other suitable processes. Subsequently, the operation 522 performs a CMP process to the conductive layers 262 and 260 to remove them from the top surface of the dielectric layer 234. In various embodiments, the method 500 deposits a magnetic material in at least one of the layers or features 218, 220, 226, 260, and 262.

At operation 524, the method 500 (FIG. 3B) performs further fabrication to the device 200, such as forming one or more metal layers over the metal layer 306, forming passivation layer(s), and performing more back end of line processes.

Although not intended to be limiting, one or more embodiments of the present disclosure provide many benefits to a semiconductor device and the formation thereof. For example, embodiments of the present disclosure provide a semiconductor device with an array of MRAM cells in an MRAM region. Each MRAM cell includes a magnetic shield for shielding the MRAM cell from external magnetic fields, thereby improving the reliability of the MRAM cell. The magnetic shield may be provided as a magnetic material in a bottom electrode, a magnetic material in a sidewall spacer, and/or a magnetic material in a top electrode. A magnetic material in the bottom electrode or in the top electrode can block vertical magnetic interference, while a magnetic material in the sidewall spacer can block horizontal magnetic interference. The MRAM cells of the present disclosure can be implemented as a standalone memory device or be implemented as an embedded memory that is integrated with logic devices. Furthermore, formation of this semiconductor device can be readily integrated into existing semiconductor fabrication processes.

In one example aspect, the present disclosure is directed to a semiconductor device. The semiconductor device includes a bottom electrode; a magnetic tunneling junction (MTJ) element over the bottom electrode; a top electrode over the MTJ element; and a sidewall spacer abutting the MTJ element, wherein at least one of the bottom electrode, the top electrode, and the sidewall spacer includes a magnetic material.

In an embodiment of the semiconductor device, the top electrode includes the magnetic material. In a further embodiment, the magnetic material is formed as a barrier layer underlying a conductive layer. In an embodiment, the conductive layer includes copper. In another further embodiment, the top electrode includes a barrier layer including tantalum and a conductive layer of the magnetic material formed over the barrier layer.

In another embodiment of the semiconductor device, the bottom electrode includes the magnetic material. In a further embodiment, the bottom electrode includes a barrier layer of the magnetic material, and a conductive material formed over the barrier layer. In another further embodiment, the bottom electrode includes a barrier layer including at least one of TiN and TaN, and the magnetic material is formed over the barrier layer.

In an embodiment of the semiconductor device, the sidewall spacer includes multiple layers, and one of the layers includes the magnetic material. In a further embodiment, the magnetic material is Co or NiFe. In another further embodiment, the magnetic material is disposed between a nitride spacer and an oxide spacer.

In an embodiment of the semiconductor device, at least two of the bottom electrode, the top electrode, and the sidewall spacer include one or more magnetic materials. In another embodiment, all of the bottom electrode, the top electrode, and the sidewall spacer include one or more magnetic materials.

In another example aspect, the present disclosure is directed to a semiconductor device that includes a bottom electrode; a magnetic tunneling junction (MTJ) element over the bottom electrode; a top electrode over the MTJ element; and a sidewall spacer abutting the MTJ element, wherein the sidewall spacer includes a magnetic material.

In an embodiment of the semiconductor device, the magnetic material is at least one of Co and NiFe. In another embodiment, the sidewall spacer includes a stack of a nitride spacer, the magnetic material, and an oxide spacer. In another embodiment, at least one of the bottom electrode and the top electrode include another magnetic material.

In yet another example aspect, the present disclosure is directed to a method that includes forming a first via hole in a first dielectric layer; forming a first barrier layer in the first via hole; forming a first conductive layer over the first barrier layer and in the first via hole; and depositing a magnetic tunneling junction (MTJ) stack over the first conductive layer, the first barrier layer, and the first dielectric layer, wherein the MTJ stack is electrically connected to the first conductive layer. The method further includes patterning the MTJ stack, resulting in a patterned MTJ stack; depositing a nitride spacer over sidewalls of the patterned MTJ stack; depositing a protective spacer over the nitride spacer; depositing an oxide spacer over the protective spacer; depositing a second dielectric layer over the oxide spacer and the patterned MTJ stack; forming a second via hole in the second dielectric layer; forming a second barrier layer in the second via hole; and forming a second conductive layer over the second barrier layer and in the second via hole, wherein the second conductive layer is electrically connected to the patterned MTJ stack, wherein at least one of the first barrier layer, the first conductive layer, the protective spacer, the second barrier layer, and the second conductive layer includes a magnetic material.

In an embodiment of the method, the magnetic material includes Co. In an embodiment, before the patterning of the MTJ stack, the method further includes depositing a hard mask layer having TiN over the MTJ stack, wherein the forming of the second via hole includes removing a portion of the hard mask layer exposed in the second via hole, thereby exposing a top surface of the MTJ stack.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a bottom electrode;
a magnetic tunneling junction (MTJ) element over the bottom electrode;
a top electrode over the MTJ element; and
a sidewall spacer abutting the MTJ element, wherein the top electrode includes a first conductive layer and a first barrier layer, wherein the first barrier layer includes a first sublayer, a second sublayer on the first sublayer, and a third sublayer on the second sublayer, wherein each of the first, second, and third sublayers is disposed on a bottom and two sidewall surfaces of the first conductive layer, wherein the second sublayer includes a magnetic material.

2. The semiconductor device of claim 1, wherein the first conductive layer includes copper.

3. The semiconductor device of claim 1, wherein the first sublayer includes tantalum.

4. The semiconductor device of claim 1, wherein the bottom electrode includes a second conductive layer and a second barrier layer, wherein the second barrier layer includes a fourth sublayer, a fifth sublayer on the fourth sublayer, and a sixth sublayer on the fifth sublayer, wherein each of the fourth, fifth, and sixth sublayers is disposed on a bottom and two sidewall surfaces of the second conductive layer, wherein the fifth sublayer includes another magnetic material.

5. The semiconductor device of claim 4, wherein the fourth sublayer includes at least one of TiN and TaN.

6. The semiconductor device of claim 1, wherein the sidewall spacer includes multiple layers, and one of the layers includes another magnetic material.

7. The semiconductor device of claim 6, wherein the magnetic material in the sidewall spacer is Co or NiFe.

8. The semiconductor device of claim 6, wherein the magnetic material in the sidewall spacer is disposed between a nitride spacer and an oxide spacer.

9. The semiconductor device of claim 1, wherein at least one of the bottom electrode and the sidewall spacer include one or more magnetic materials.

10. The semiconductor device of claim 1, wherein all of the bottom electrode, the top electrode, and the sidewall spacer include one or more magnetic materials.

11. A semiconductor device, comprising:
a bottom electrode;
a magnetic tunneling junction (MTJ) element over the bottom electrode;
a top electrode over the MTJ element; and
a sidewall spacer abutting the MTJ element, wherein the sidewall spacer includes a first magnetic material, wherein the top electrode includes a first conductive layer and a first barrier layer on a bottom and two sidewalls of the first conductive layer, wherein each of the first conductive layer and the first barrier layer includes a second magnetic material, wherein the first barrier layer includes a first sublayer, a second sublayer on the first sublayer, and a third sublayer on the second sublayer, wherein each of the first, second, and third sublayers is disposed on a bottom and two sidewall surfaces of the first conductive layer, wherein the second sublayer includes the second magnetic material.

12. The semiconductor device of claim 11, wherein the first magnetic material includes at least one of Co and NiFe.

13. The semiconductor device of claim 11, wherein the sidewall spacer includes a stack of a nitride spacer, the first magnetic material, and an oxide spacer.

14. The semiconductor device of claim 11, wherein the bottom electrode includes another magnetic material.

15. A semiconductor device, comprising:
a bottom electrode;
a magnetic tunneling junction (MTJ) element over the bottom electrode;
a conductive hard mask layer over the MTJ element;
a top electrode over the conductive hard mask layer; and
a sidewall spacer abutting the MTJ element, wherein the top electrode includes a first conductive layer and a first barrier layer, the first barrier layer includes a first sublayer directly on the conductive hard mask layer and the sidewall spacer, a second sublayer on the first sublayer, and a third sublayer on the second sublayer, wherein at least the second sublayer is disposed on a bottom and two sidewall surfaces of the first conductive layer, wherein the second sublayer includes a first magnetic material.

16. The semiconductor device of claim 15, wherein the conductive hard mask layer includes a metal nitride.

17. The semiconductor device of claim 16, wherein the first magnetic material includes cobalt or NiFe.

18. The semiconductor device of claim 1, further comprising a conductive hardmask disposed between the top electrode and the MTJ element and surrounded by the sidewall spacer at least on two sides.

19. The semiconductor device of claim 11, wherein the second magnetic material includes cobalt (Co).

20. The semiconductor device of claim 15, wherein the bottom electrode includes a second conductive layer and a second barrier layer, wherein the second barrier layer includes a fourth sublayer, a fifth sublayer on the fourth sublayer, and a sixth sublayer on the fifth sublayer, wherein each of the fourth, fifth, and sixth sublayers is disposed on a bottom and two sidewall surfaces of the second conductive layer, wherein the fifth sublayer includes a second magnetic material.

* * * * *